United States Patent
Matsumoto

(10) Patent No.: US 11,476,086 B2
(45) Date of Patent: Oct. 18, 2022

(54) MULTI-BEAM WRITING METHOD AND MULTI-BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/166,050

(22) Filed: Feb. 3, 2021

(65) Prior Publication Data

US 2021/0257184 A1  Aug. 19, 2021

(30) Foreign Application Priority Data

Feb. 18, 2020 (JP) .............................. JP2020-025336

(51) Int. Cl.
  *H01J 37/302* (2006.01)
  *H01J 37/147* (2006.01)
  *H01J 37/317* (2006.01)

(52) U.S. Cl.
  CPC ...... *H01J 37/3026* (2013.01); *H01J 37/1472* (2013.01); *H01J 37/3177* (2013.01); *H01J 2237/1504* (2013.01); *H01J 2237/31762* (2013.01); *H01J 2237/31774* (2013.01)

(58) Field of Classification Search
  CPC ............... H01J 37/3023; H01J 37/3026; H01J 37/1472; H01J 37/3177; H01J 2237/1504; H01J 2237/317662; H01J 2237/31774
  See application file for complete search history.

(56) References Cited

U.S. PATENT DOCUMENTS

| 2008/0237460 A1 | 10/2008 | Fragner et al. |
| 2015/0340196 A1 | 11/2015 | Matsumoto et al. |
| 2016/0155604 A1* | 6/2016 | Matsumoto ......... H01J 37/3177 250/400 |

FOREIGN PATENT DOCUMENTS

| JP | 2015-228471 A | 12/2015 | |
| JP | 2016-1725 A | 1/2016 | |
| WO | WO-2010134026 A2 * | 11/2010 | ............. B82Y 10/00 |
| WO | WO-2011155122 A1 * | 12/2011 | ......... G01N 23/2251 |

\* cited by examiner

*Primary Examiner* — David E Smith
(74) *Attorney, Agent, or Firm* — Oblon, McClelland, Maier & Neustadt, L.L.P.

(57) ABSTRACT

A multi-beam writing method includes acquiring a plurality of deflection coordinates for deflecting a beam to each of a plurality of pixels which are in each beam pitch region of a plurality of beam pitch regions, a number of pixels to be exposed by a beam in the each beam pitch region during each of tracking control period performed such that the multiple beams collectively follow a movement of a stage, and a deflection movement amount of the multiple beams at a time of tracking reset for resetting a tracking starting position after each of the tracking control period has passed; and generating a deflection sequence defined using the plurality of deflection coordinates, the number of pixels to be exposed during each of the tracking control period, and the deflection movement amount of the multiple beams at the time of tracking reset.

10 Claims, 23 Drawing Sheets

8×8 Array

6×6 Array

FIG.13A   Basic Mode
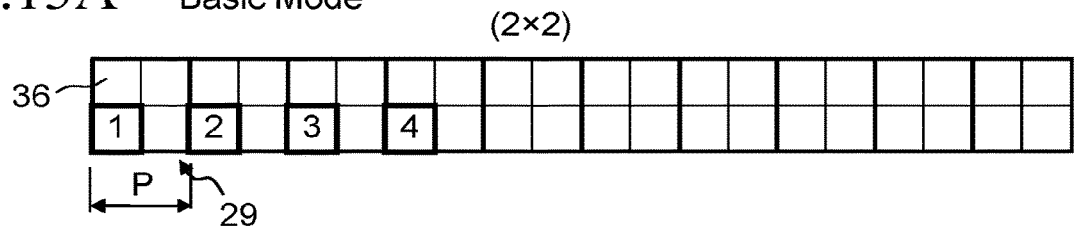
FIG.13B   Reducing pixel size (3×3)
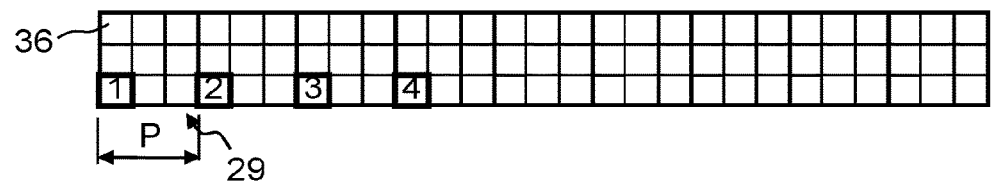
FIG.13C
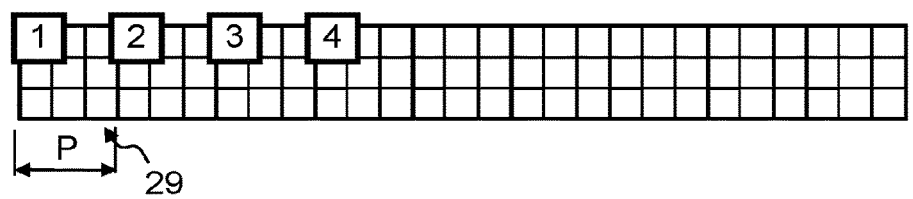
FIG.13D   Reducing the number of beams
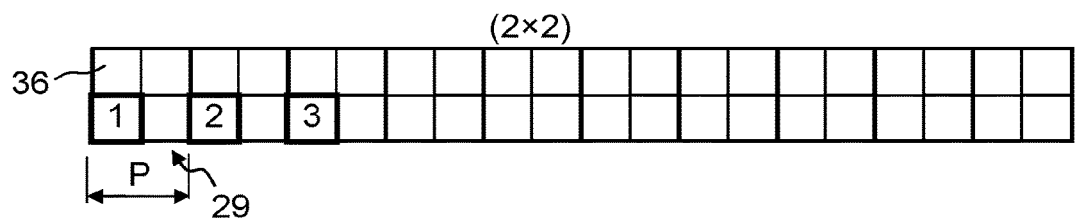

Beams to expose each pixel overlap with each other

|  | Designation Value M for designating the number of pixels to be exposed in one tracking | Pixel Size s | Beam Size S | Beam Array to be used b × c |
|---|---|---|---|---|
| High Speed Writing Mode | M1 | s1 | S1 | b1 × c1 |
| Standard Writing Mode | M2 | s1 | S1 | b1 × c1 |
| High Accuracy Writing Mode | M3 | s2 | S2 | b2 × c2 |

FIG.16

| (Xk,Yk) | (0,0)(0,1)(0,2)(1,0)(1,1)(1,2)(2,0)(2,1)(2,2) |
|---|---|
| Ej | 3,2,2,2 |
| Dj | 1,1,1,1 |

FIG.27

MULTI-BEAM WRITING METHOD AND MULTI-BEAM WRITING APPARATUS

CROSS-REFERENCE TO RELATED APPLICATION

This application is based upon and claims the benefit of priority from prior Japanese Patent Application No. 2020-025336 filed on Feb. 18, 2020 in Japan, the entire contents of which are incorporated herein by reference.

BACKGROUND OF THE INVENTION

Field of the Invention

Embodiments of the present invention relate to a multi-beam writing method and a multi-beam writing apparatus, and, for example, relate to a method for generating a writing sequence under several different conditions in multi-beam writing with a charged particle beam.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In the multi-beam writing apparatus, a tracking control which follows movement of the stage is needed when writing is performed while the stage is in continuous motion. Furthermore, in the multi-beam writing apparatus, by performing tracking control several times in a region of the pitch size of multiple beams, exposure is carried out with a plurality of beams while polarizing the beams (e.g., refer to Japanese Patent Application Laid-open (JP-A) No. 2015-228471). Therefore, a deflection sequence for performing a complicated deflection control becomes necessary.

Meanwhile, with respect to multi-beam writing, there is requirement to change a pixel size and/or to limit a beam array to be used in all the multiple beams loaded, for example. This is due to different conditions between the case where writing accuracy is emphasized even at the expense of writing speed and the case where writing speed is emphasized even at the expense of writing accuracy. As described above, a complicated deflection control is needed when writing with multiple beams is carried out while the stage is continuously moved. If the pixel size and/or the beam array to be used are changed, it becomes difficult to use the original deflection sequence as it is. Therefore, reconstructing the deflection sequence is needed. However, it is not easy to find a deflection sequence based on which the entire writing region of the target object surface can be written while responding to the change of conditions.

BRIEF SUMMARY OF THE INVENTION

According to one aspect of the present invention, a multi-beam writing method includes acquiring a pixel size which is variable and beam array information defining a beam array to be used for exposure; acquiring, based on the pixel size and the beam array information, a plurality of deflection coordinates for deflecting a beam to each of a plurality of pixels which are in each beam pitch region of a plurality of beam pitch regions obtained by dividing a writing region on a target object by a beam pitch size of multiple beams, a number of pixels to be exposed by a beam in the each beam pitch region during each of tracking control period performed such that the multiple beams collectively follow a movement of a stage, and a deflection movement amount of the multiple beams at a time of tracking reset for resetting a tracking starting position after each of the tracking control period has passed; generating a deflection sequence defined using the plurality of deflection coordinates, the number of pixels to be exposed during each of the tracking control period, and the deflection movement amount of the multiple beams at the time of tracking reset; and writing a pattern on the target object with the multiple beams while deflecting the multiple beams according to the deflection sequence.

According to another aspect of the present invention, a multi-beam writing apparatus includes a parameter acquisition circuit configured to acquire a pixel size which is variable and beam array information defining a beam array to be used for exposure; an acquisition circuit configured to acquire, based on the pixel size and the beam array information, a plurality of deflection coordinates for deflecting a beam to each of a plurality of pixels which are in each beam pitch region of a plurality of beam pitch regions obtained by dividing a writing region on a target object by a beam pitch size of multiple beams, a number of pixels to be exposed by a beam in the each beam pitch region during each tracking control period performed such that the multiple beams collectively follow a movement of a stage, and a deflection movement amount of the multiple beams at a time of tracking reset for resetting a tracking starting position after a tracking control period has passed; a generation circuit configured to generate a deflection sequence defined using the plurality of deflection coordinates, the number of pixels to be exposed during each of the tracking control period, and the deflection movement amount of the multiple beams at the time of tracking reset; and a writing mechanism configured to include a movable stage for mounting the target object thereon and a deflector for deflecting the multiple beams, and configured to write a pattern on the target object with the multiple beams while deflecting the multiple beams according to the deflection sequence.

According to yet another aspect of the present invention, a multi-beam writing method includes selecting a writing mode from a high accuracy writing mode for writing highly accurately and a high speed writing mode for writing at high speed; dividing a writing region on a target object to be irradiated with multiple beams into a plurality of pixel regions by a pixel size which is variable according to the writing mode selected; and writing a pattern on the target object by applying the multiple beams whose beam pitch is fixed regardless of the writing mode selected to a plurality of pixels on the target object divided by the pixel size.

According to yet another aspect of the present invention, a multi-beam writing apparatus includes a selection circuit configured to select a writing mode from a high accuracy writing mode for writing highly accurately and a high speed writing mode for writing at high speed; a division circuit configured to divide a writing region on a target object to be irradiated with multiple beams into a plurality of pixel regions by a pixel size which is variable according to the writing mode selected; and a writing mechanism configured to include a stage for mounting the target object thereon and a deflector for deflecting the multiple beams, and to write a pattern on the target object by applying the multiple beams whose beam pitch is fixed regardless of the writing mode selected to a plurality of pixels on the target object divided by the pixel size.

BRIEF DESCRIPTION OF THE DRAWINGS

FIGS. 13A to 13D each illustrates a relation between a beam array and a pixel when a pixel size, a beam size, and the number of beams are varied according to the first embodiment;

FIG. 16 shows an example of a correlation table of writing modes and basic parameters according to the first embodiment;

FIG. 27 shows an example of format of a deflection sequence according to the first embodiment.

DETAILED DESCRIPTION OF THE INVENTION

Embodiments below describe a writing method and a writing apparatus that can write the entire writing region even when the pixel size and/or the beam array, etc. are changed.

Embodiments below describe a configuration in which an electron beam is used as an example of a charged particle beam. The charged particle beam is not limited to the electron beam, and other charged particle beam such as an ion beam may also be used. Moreover, Embodiments below describe a configuration in which a writing apparatus is used as an example of an exposure apparatus.

First Embodiment

Figure 1:
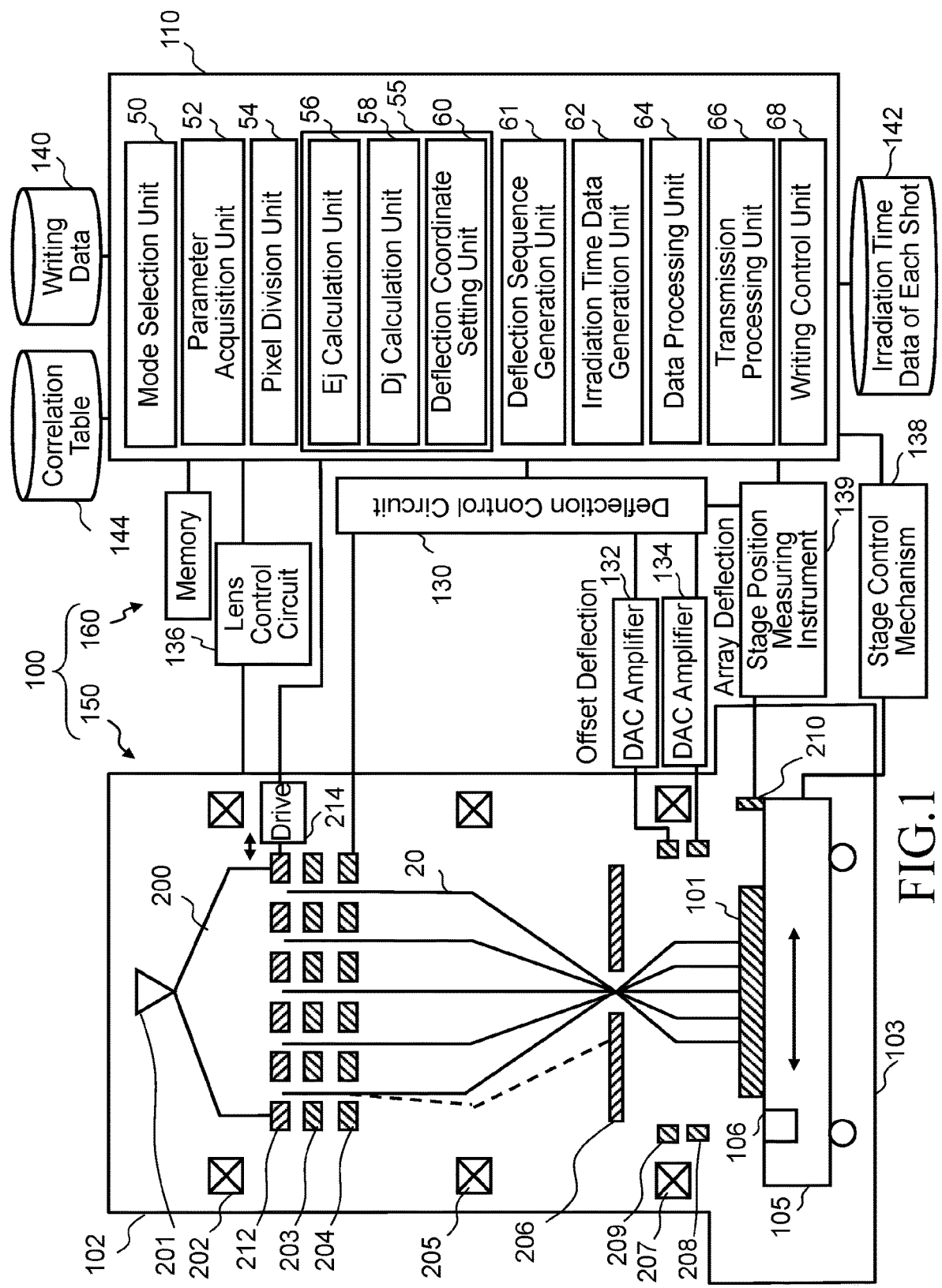
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi-charged particle beam writing apparatus, and a multi-charged particle beam exposure apparatus. The writing mechanism 150 includes an electron beam column 102 (electron optical column) and a writing chamber 103. In the electron beam column 102, there are disposed an electron gun 201, an illumination lens 202, a first shaping aperture array substrate 212, a second shaping aperture array substrate 203, a blanking aperture array mechanism 204, a reducing lens 205, a limiting aperture substrate 206, an objective lens 207, a main deflector 208, a sub deflector 209, and a drive mechanism 214. In the writing chamber 103, an XY stage 105 is disposed. On the XY stage 105, there is placed a target object or "sample" 101 such as a mask serving as a writing target substrate when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written.

Further, on the XY stage 105, a mirror 210 for measuring the position of the XY stage 105 is placed.

The control system circuit 160 includes a control computer 110, a memory 112, a deflection control circuit 130, DAC (digital-analog converter) amplifier units 132 and 134, a lens control circuit 136, a stage control mechanism 138, a stage position measuring instrument 139, and storage devices 140, 142, and 144 such as magnetic disk drives. The control computer 110, the memory 112, the deflection control circuit 130, the lens control circuit 136, the stage control mechanism 138, the stage position measuring instrument 139, and the storage devices 140, 142, and 144 are connected to each other through a bus (not shown). The DAC amplifier units 132 and 134 and the blanking aperture array mechanism 204 are connected to the deflection control circuit 130. The sub deflector 209 is composed of at least four electrodes (or "at least four poles"), and controlled by the deflection control circuit 130 through a corresponding amplifier of the DAC amplifier unit 132 disposed for each electrode. The main deflector 208 is composed of at least four electrodes (or "at least four poles"), and controlled by the deflection control circuit 130 through a corresponding amplifier of the DAC amplifier unit 134 disposed for each electrode. Based on the principle of laser interferometry, the stage position measuring instrument 139 measures the position of the XY stage 105 by receiving a reflected light from the mirror 210.

In the control computer 110, there are arranged a mode selection unit 50, a basic parameter acquisition unit 52, a pixel division unit 54, a parameter acquisition unit 55, a deflection sequence generation unit 61, an irradiation time data generation unit 62, a data processing unit 64, a transmission processing unit 66, and a writing control unit 68. In the parameter acquisition unit 55, an exposure pixel number "Ej" calculation unit 56, a deflection movement amount "Dj" calculation unit 58, and a deflection coordinate setting unit 60 are arranged. Each of the " . . . units" such as the mode selection unit 50, the basic parameter acquisition unit 52, the pixel division unit 54, the parameter acquisition unit 55 (the exposure pixel number "Ej" calculation unit 56, the deflection movement amount "Dj" calculation unit 58, and the deflection coordinate setting unit 60), the deflection sequence generation unit 61, the irradiation time data generation unit 62, the data processing unit 64, the transmission processing unit 66, and the writing control unit 68 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the mode selection unit 50, the basic parameter acquisition unit 52, the pixel division unit 54, the parameter acquisition unit 55 (the exposure pixel number "Ej" calculation unit 56, the deflection movement amount "Dj" calculation unit 58, and the deflection coordinate setting unit 60), the deflection sequence generation unit 61, the irradiation time data generation unit 62, the data processing unit 64, the transmission processing unit 66, and the writing control unit 68, and information being operated are stored in the memory 112 each time.

The writing mechanism 150 is controlled by the writing control unit 68. Specifically, under the control of the writing control unit 68, the electron gun 201 is controlled by a high voltage power supply circuit (not shown). Moreover, under the control of the writing control unit 68, the DAC amplifier units 132 and 134 and the blanking aperture array mechanism 204 are controlled by the deflection control circuit 130. Moreover, under the control of the writing control unit 68, the illumination lens 202, the reducing lens 205, and the objective lens 207 are controlled by the lens control circuit 136. Furthermore, under the control of the writing control unit 68, the position of the XY stage 105 is controlled by the stage control mechanism 138. Furthermore, under the control of the writing control unit 68, the position of the first shaping aperture array substrate 212 is controlled by the drive mechanism 214. The stage position measured by the position measuring instrument 139 is output to the deflection control circuit 130 and the writing control unit 68.

Writing data is input from the outside of the writing apparatus 100, and stored in the storage device 140. The writing data usually defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
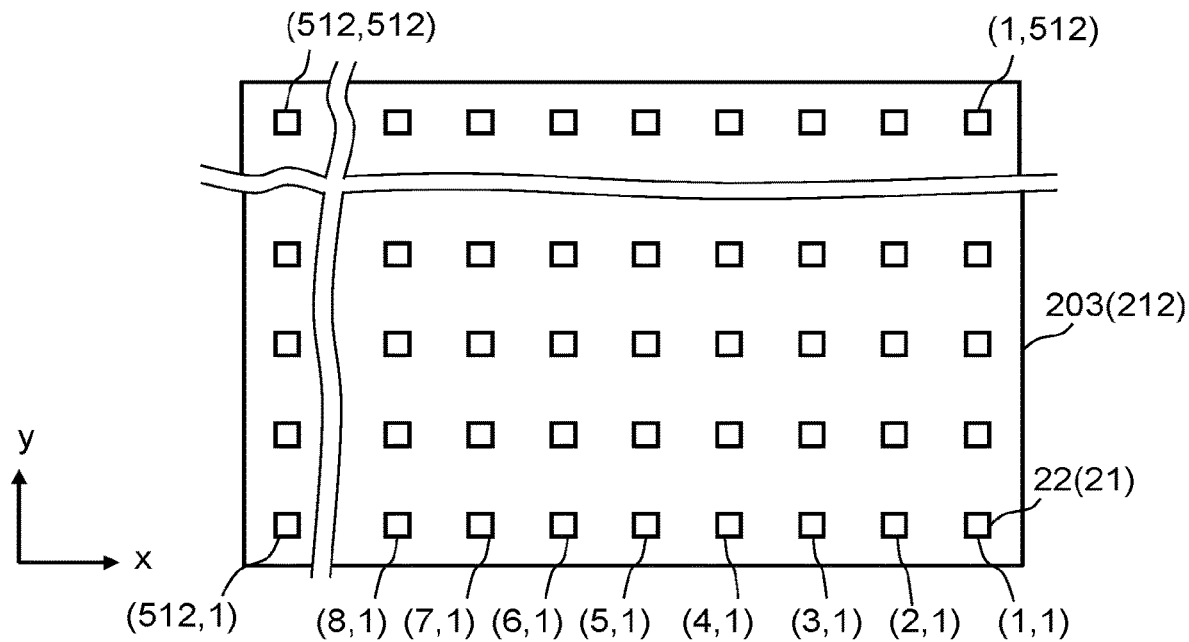
FIG. 2 is a conceptual diagram showing a configuration of the first and second shaping aperture array substrates according to the first embodiment.

FIG. 2 is a conceptual diagram showing a configuration of the first and second shaping aperture array substrates according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the second shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. Multiple beams 20 are formed by letting portions of the electron beam 200 individually pass through a corresponding one of a plurality of holes 22. In other words, the shaping aperture array substrate 203 forms multiple beams. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows.

In the first shaping aperture array substrate 212, holes (openings) 21 of p rows long (length in the y direction) and q columns wide (width in the x direction) (p≥2, q≥2) are formed at the same arrangement pitch as that of the second shaping aperture array substrate 203. The sizes of the hole 21 and the hole 22 may be the same or different. For example, the hole 21 is formed in the size larger than that of the hole 22.

Next, operations of the writing mechanism 150 will be described. The electron beam 200 emitted from the electron gun 201 (emission source) almost perpendicularly (e.g., vertically) illuminates the whole of the first shaping aperture array substrate 212 by the illumination lens 202. A plurality of rectangular (including square, etc.) holes 21 (openings) are formed in the first shaping aperture array substrate 212. The region including all the plurality of holes 21 is irradiated with the electron beam 200. For example, rectangular (including square) multiple beams (a plurality of electron beams) 23 are formed by letting portions of the electron beam 200, which irradiates the positions of the plurality of holes 21, individually pass through a corresponding one of the plurality of holes 21 in the first shaping aperture array substrate 212.

Figure 3:
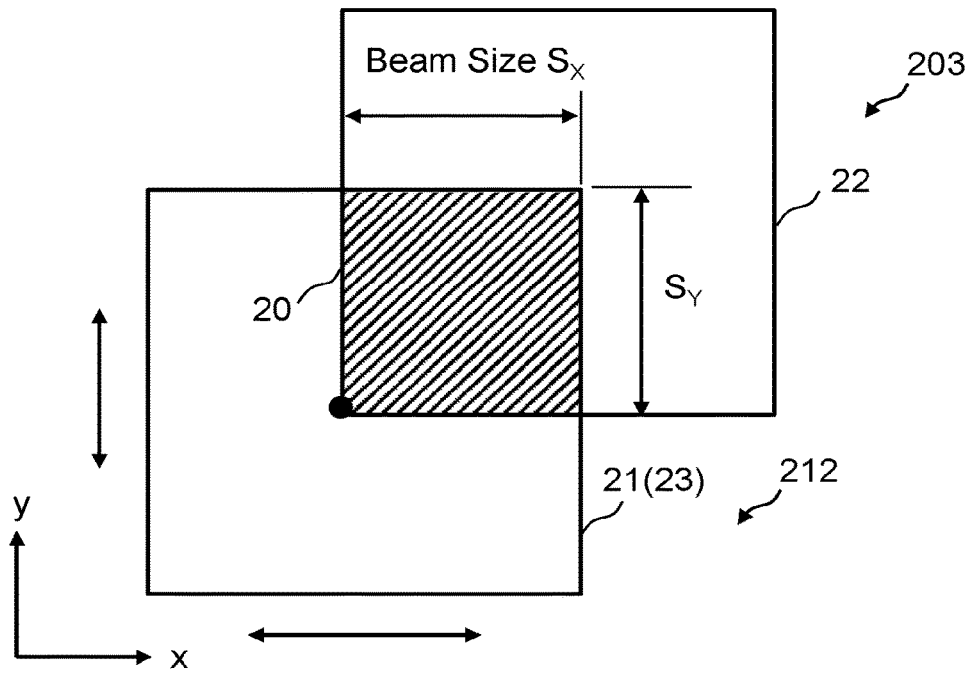
FIG. 3 illustrates a variable shaped beam according to the first embodiment.

FIG. 3 illustrates a variable shaped beam according to the first embodiment. The multiple beams 23 formed by the first shaping aperture array substrate 212 travel to a plurality of holes 22 in the second shaping aperture array substrate 203. For example, rectangular (including square) multiple beams (a plurality of electron beams) 20 are formed by letting at least a portion of each beam of the multiple beams 23 individually pass through a corresponding one of the plurality of holes 22. In other words, the multiple beams 20 are formed by passing through both the plurality of holes 21 of the first shaping aperture array substrate 212, and the plurality of holes 22 of the second shaping aperture array substrate 203. Here, if the first shaping aperture array substrate 212 is moved in a two-dimensional direction in the plane (x-y plane) orthogonal to the central axis (optical axis) of the electron beam 200 by the drive mechanism 214 controlled by the writing control unit 68, as shown in FIG. 3, the region where the hole 21 and the hole 22 overlap each other can be shifted on the trajectory of each beam. Thus, each of the multiple beams 20 is variably shaped by adjusting the size of the region where the hole 21 and the hole 22 overlap each other. In other words, the size of each of the multiple beams 20 to be formed is controlled. The multiple beams 20 whose size has been variably controlled travel to the blanking aperture array mechanism 204.

Figure 4:
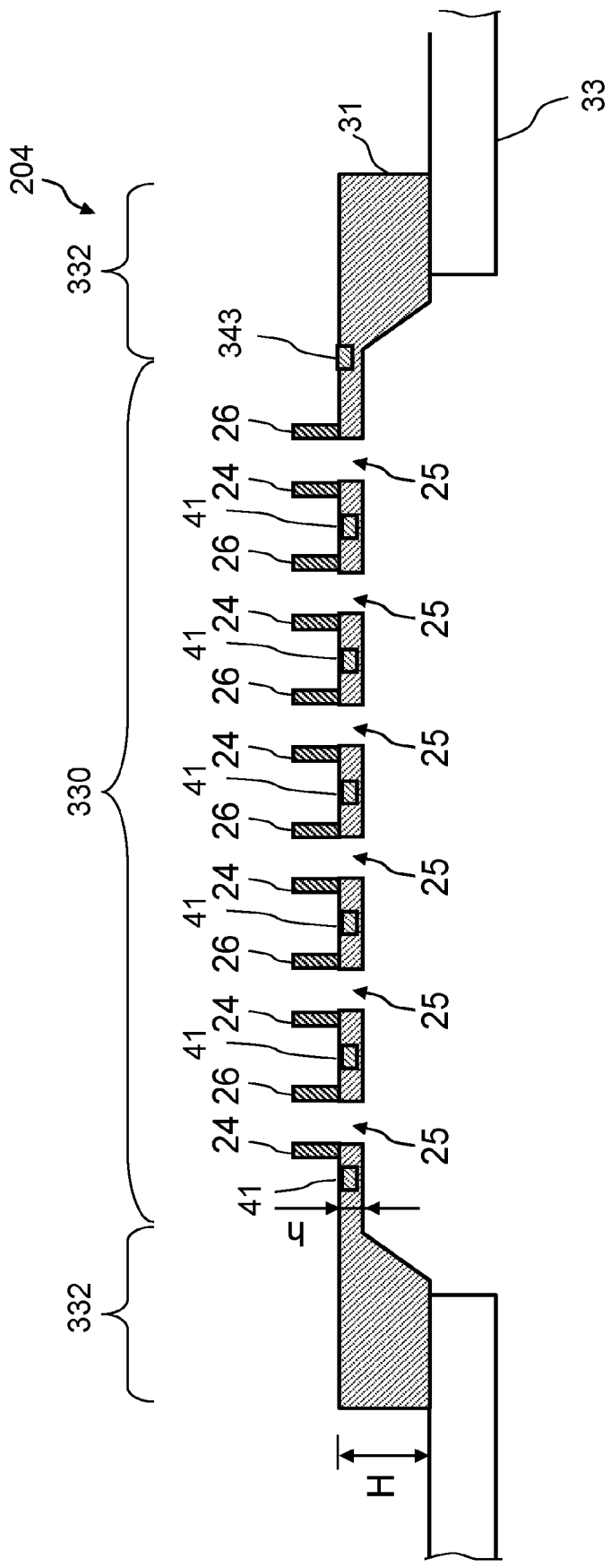
FIG. 4 is a sectional view showing a configuration of a blanking aperture array mechanism according to the first embodiment.

FIG. 4 is a sectional view showing a configuration of a blanking aperture array mechanism according to the first embodiment.

Figure 5:
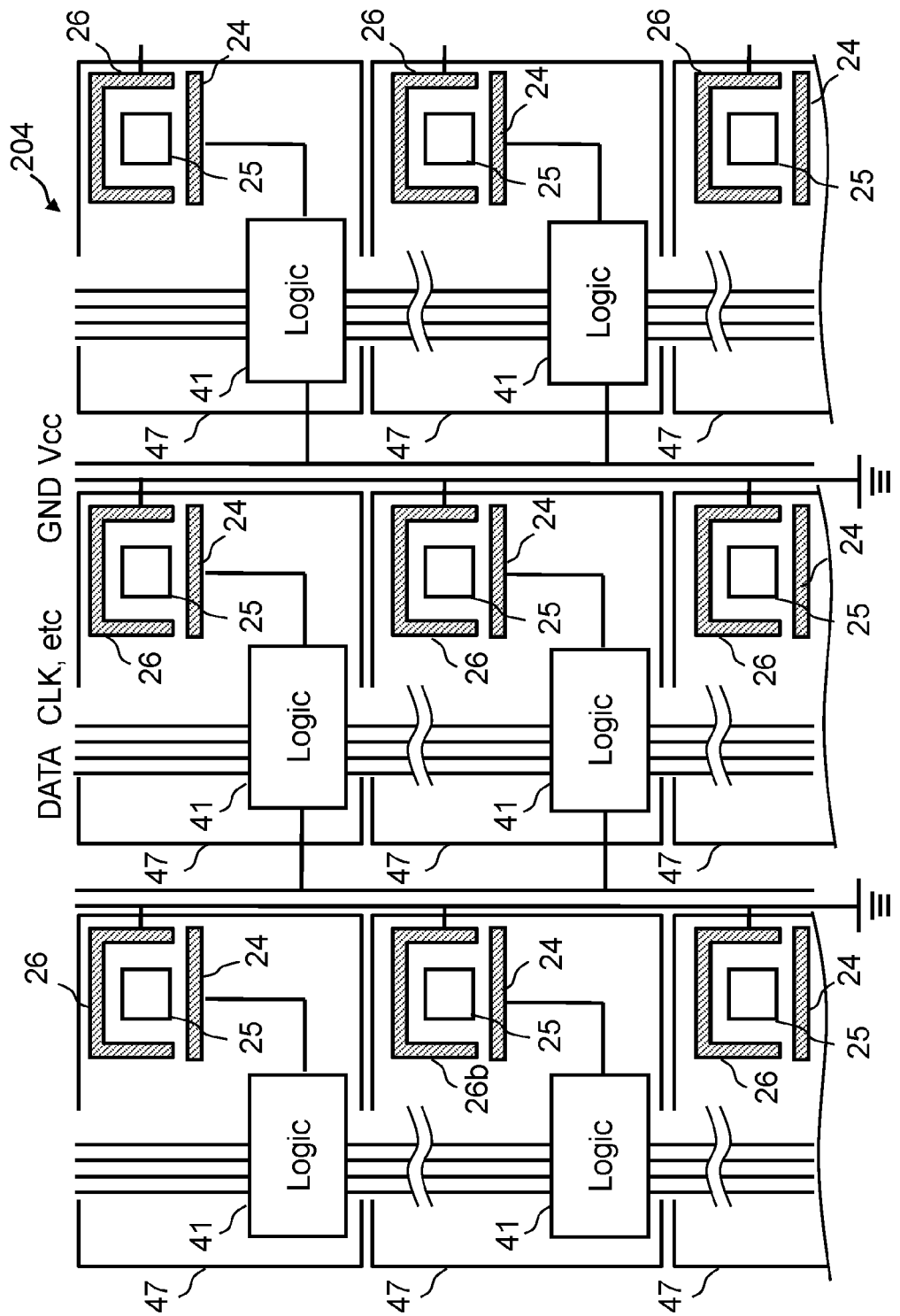
FIG. 5 is a top view conceptual diagram showing a portion of the structure in a membrane region of a blanking aperture array mechanism according to the first embodiment.

FIG. 5 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 4 is not in accordance with that of FIG. 5. With regard to the structure of the blanking aperture array mechanism 204, a blanking aperture array substrate 31 being a semiconductor substrate made of silicon, etc. is placed on a support table 333 as shown in FIG. 4. The central part of the blanking aperture array substrate 31 is for example shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the blanking aperture array substrate 31 is supported on the support table 333. The central part of the support table 333 is open, and the membrane region 330 is located at this opening region.

In the membrane region 330 of the blanking aperture array substrate 31, a plurality of openings are formed at positions where multiple beams pass through. Specifically, in the membrane region 330 of the blanking aperture array substrate 31, passage holes 25 (openings) through each of which a corresponding one of the multiple beams 20 passes are formed at positions each corresponding to each hole 22 in the second shaping aperture array substrate 203 shown in FIG. 2. In other words, in the membrane region 330 of the blanking aperture array substrate 31, there are formed a plurality of passage holes 25 in an array through each of which a corresponding beam of the electron multiple beams 20 passes. Moreover, in the membrane region 330 of the blanking aperture array substrate 31, there are arranged a plurality of electrode pairs each composed of two electrodes being located opposite to each other with respect to a corresponding one of the plurality of passage holes 25. Specifically, each of a plurality of control electrodes 24 being one of the two electrodes is arranged close to a corresponding one of a plurality of passage holes 25 in the blanking aperture array substrate 31. Each of a plurality of counter electrodes 26 being the other one of the two electrodes is arranged to be facing a corresponding one of the plurality of control electrodes 24 across a corresponding one of the plurality of passage holes 25 in the blanking aperture array substrate 31. In the membrane region 330, as shown in FIGS. 4 and 5, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 and inside the blanking aperture array substrate 31 (in the blanking aperture array substrate), there is arranged the control circuit 41 (logic circuit; cell) which applies a deflection voltage to the control electrode 24 for the passage hole 25 concerned. The counter electrode 26 for each beam is grounded.

As shown in FIG. 5, n bit (e.g., ten bit) parallel lines for control signals are connected to each control circuit 41. In addition to the n-bit parallel lines for irradiation time control signals (data), lines for a clock signal, a load signal, a shot signal, a power supply and the like are connected to each control circuit 41. Alternatively, a part of the parallel lines may be used as the lines for a clock signal, a load signal, a shot signal, a power supply, and the like. An individual blanking mechanism 47 composed of the control electrode 24, the counter electrode 26, and the control circuit 41 is configured for each beam of the multiple beams 20. In the case of FIG. 4, the control electrode 24, the counter electrode 26, and the control circuit 41 are arranged in the membrane region 330 with a thin film thickness of the blanking aperture array substrate 31. However, it is not limited thereto.

Figure 6:
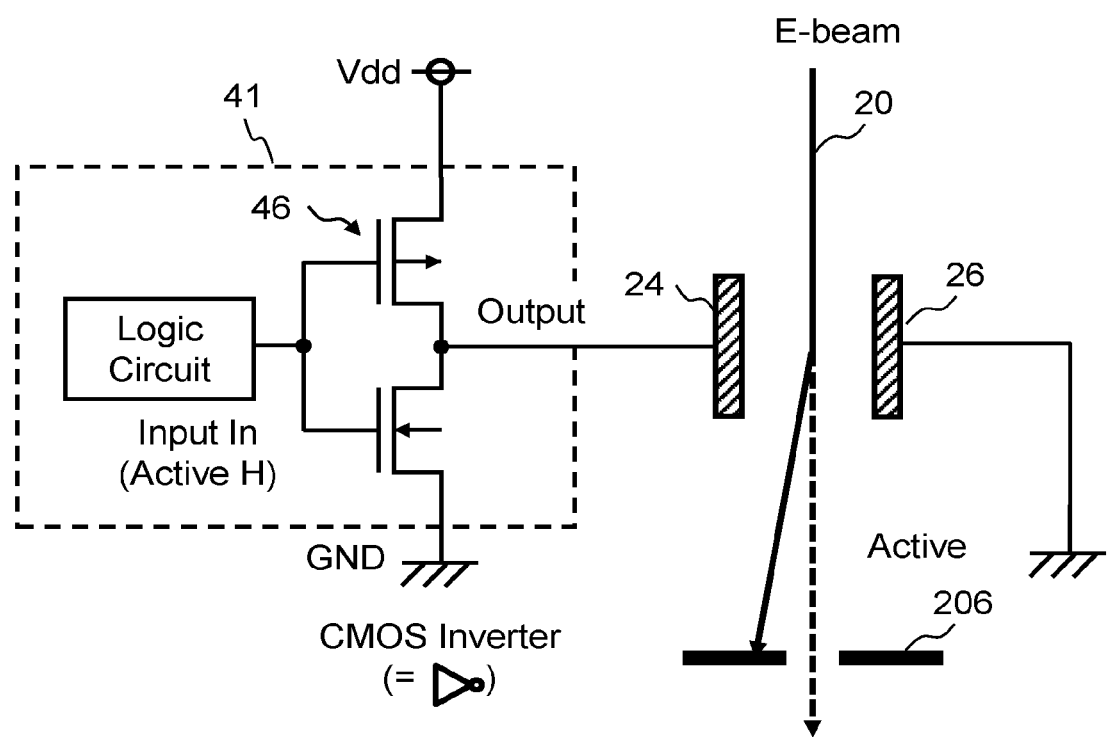
FIG. 6 shows an example of an individual blanking mechanism according to the first embodiment.

FIG. 6 shows an example of an individual blanking mechanism according to the first embodiment. As shown in FIG. 6, an amplifier 46 (an example of a switching circuit) is arranged in the control circuit 41. In the case of FIG. 6, a CMOS (complementary MOS) inverter circuit is arranged as an example of the amplifier 46. The CMOS inverter circuit is connected to a positive potential (Vdd: blanking potential: first potential) (e.g., 5 V) (beam OFF potential) and to a ground potential (GND: second potential) (beam ON potential). The output line (OUT) of the CMOS inverter circuit is connected to the control electrode 24. On the other hand, the counter electrode 26 is applied with a ground potential. A plurality of control electrodes 24, each of which is applied with a blanking potential and a ground potential in a switchable manner, are arranged on the blanking aperture array substrate 31 such that each control electrode 24 and the corresponding counter electrode 26 are opposite to each other across the passage hole 25 concerned in the plurality of passage holes 25.

As an input (IN) of each CMOS inverter circuit, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby being controlled to be in a beam ON condition by making the beam concerned pass through the limiting aperture substrate 206.

The electron beam passing through a corresponding passage hole is deflected by a voltage independently applied to a pair of the control electrode 24 and the counter electrode 26. Blanking control is provided by this deflection. Specifically, a pair of the control electrode 24 and the counter electrode 26 individually provides a blanking deflection of a corresponding beam of the multiple beams 20 by an electric potential switchable by the CMOS inverter circuit serving as a switching circuit corresponding to each pair. Thus, each of a plurality of blankers performs a blanking deflection of a corresponding one of the multiple beams 20 having passed through a plurality of holes 22 (openings) in the shaping aperture array substrate 203. The blanker individually performs a blanking control of a passing beam so that the beam may be in an ON state during each set-up writing time (irradiation time).

The multiple beams 20 having passed through the blanking aperture array mechanism 204 are reduced by the reducing lens 205, and go toward the hole in the center of the limiting aperture substrate 206. Then, the electron beam which was deflected by the blanker of the blanking aperture array mechanism 204 deviates (shifts) from the hole in the center of the limiting aperture substrate 206, and is blocked by the limiting aperture substrate 206. On the other hand, the electron beam which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF condition by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all the multiple beams 20 having passed through the limiting aperture substrate 206 are collectively deflected in the same direction by the main deflector 208 and the sub deflector 209 to irradiate respective beam irradiation positions on the target object 101. Moreover, for example, while the XY stage 105 is continuously moving, tracking control is performed by the main deflector 208 so that the beam irradiation position may follow the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

Figure 7:
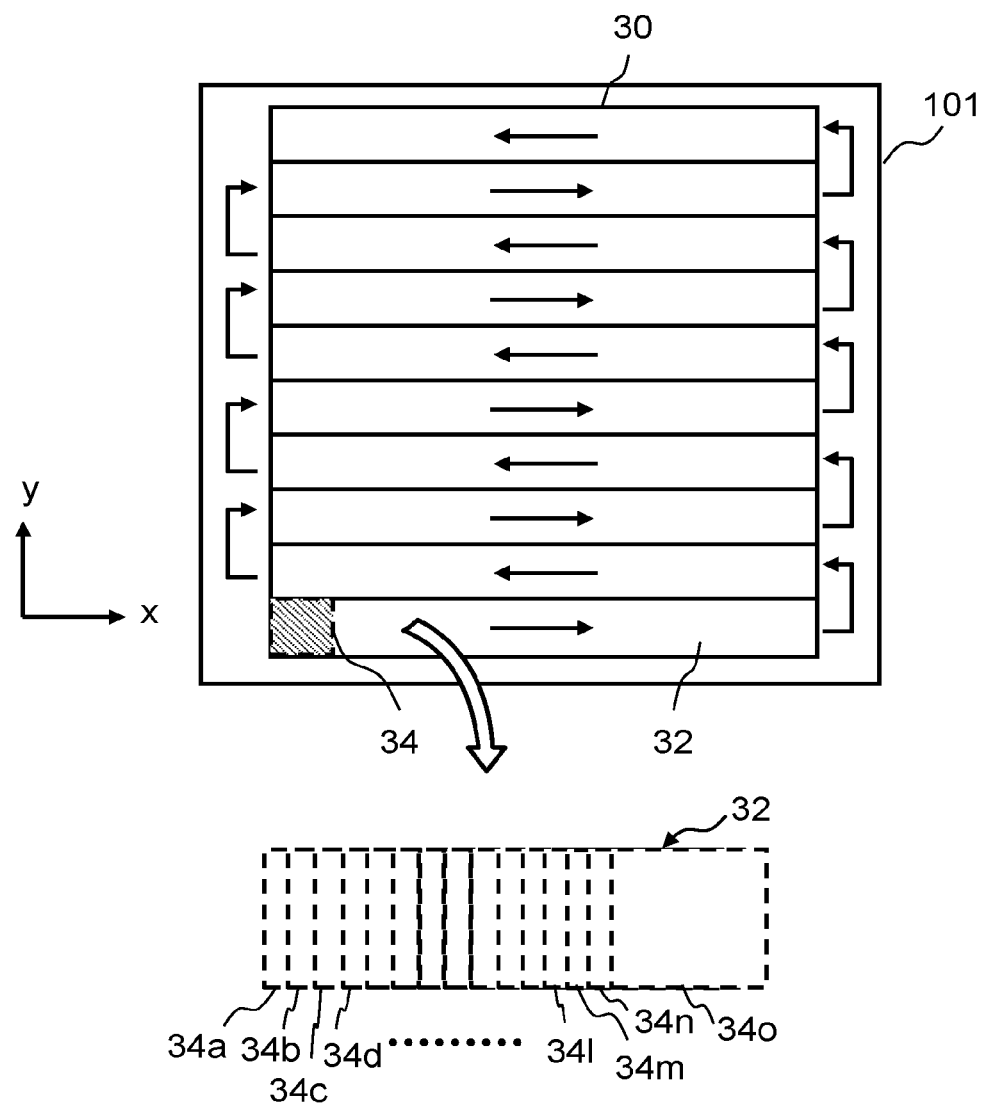
FIG. 7 is a conceptual diagram illustrating an example of a writing operation according to the first embodiment.

FIG. 7 is a conceptual diagram illustrating an example of a writing operation according to the first embodiment. As shown in FIG. 7, a writing region 30 of the target object 101 is virtually divided, for example, by a predetermined width/length in the y direction, into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203.

Figure 8:
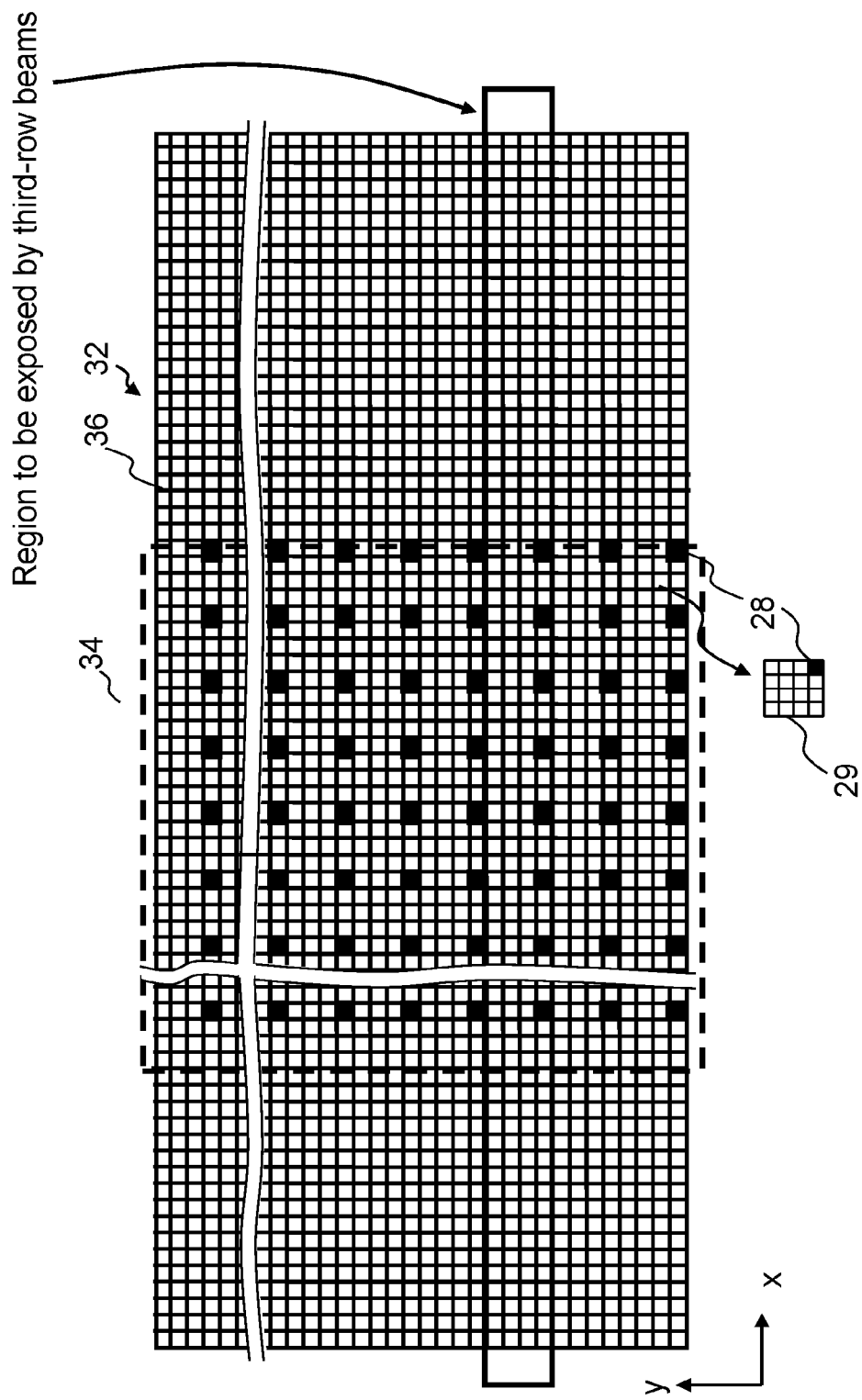
FIG. 8 shows an example of an irradiation region of multiple beams and a writing target pixel according to the first embodiment.

FIG. 8 shows an example of an irradiation region of multiple beams and a pixel to be written (writing target pixel) according to the first embodiment. In FIG. 8, the stripe region 32 is divided into a plurality of mesh regions by the beam size of each of the multiple beams 20, for example. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. FIG. 8 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the rectangular (including square) irradiation region 34 can be defined by (the number of beams in the x direction)×(beam pitch in the x direction). The y-direction size of the rectangular irradiation region 34 can be defined by (the number of beams in the y direction)×(beam pitch in the y direction). The width of the stripe region 32 is not limited to this. Preferably, the width of the stripe region 32 is n times (n being an integer of 1 or more) the size of the irradiation region 34. FIG. 8 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the beam pitch of the multiple beams. In the first embodiment, the stripe region 32 (writing region) on the target object 101 is divided into a plurality of pitch cells 29 (sub irradiation region) (pitch region between beams) by the beam pitch size of the multiple beams 20. In the example of FIG. 8, one pitch cell 29 is a square region surrounded by four adjacent pixels 28 at the four corners, and including therein just one of the four pixels 28. In other words, one pitch cell 29 is composed of a rectangular (including square) region of the beam pitch size including one pixel 28. In the case of FIG. 8, each pitch cell 29 is composed of 4×4 pixels.

Figure 9:
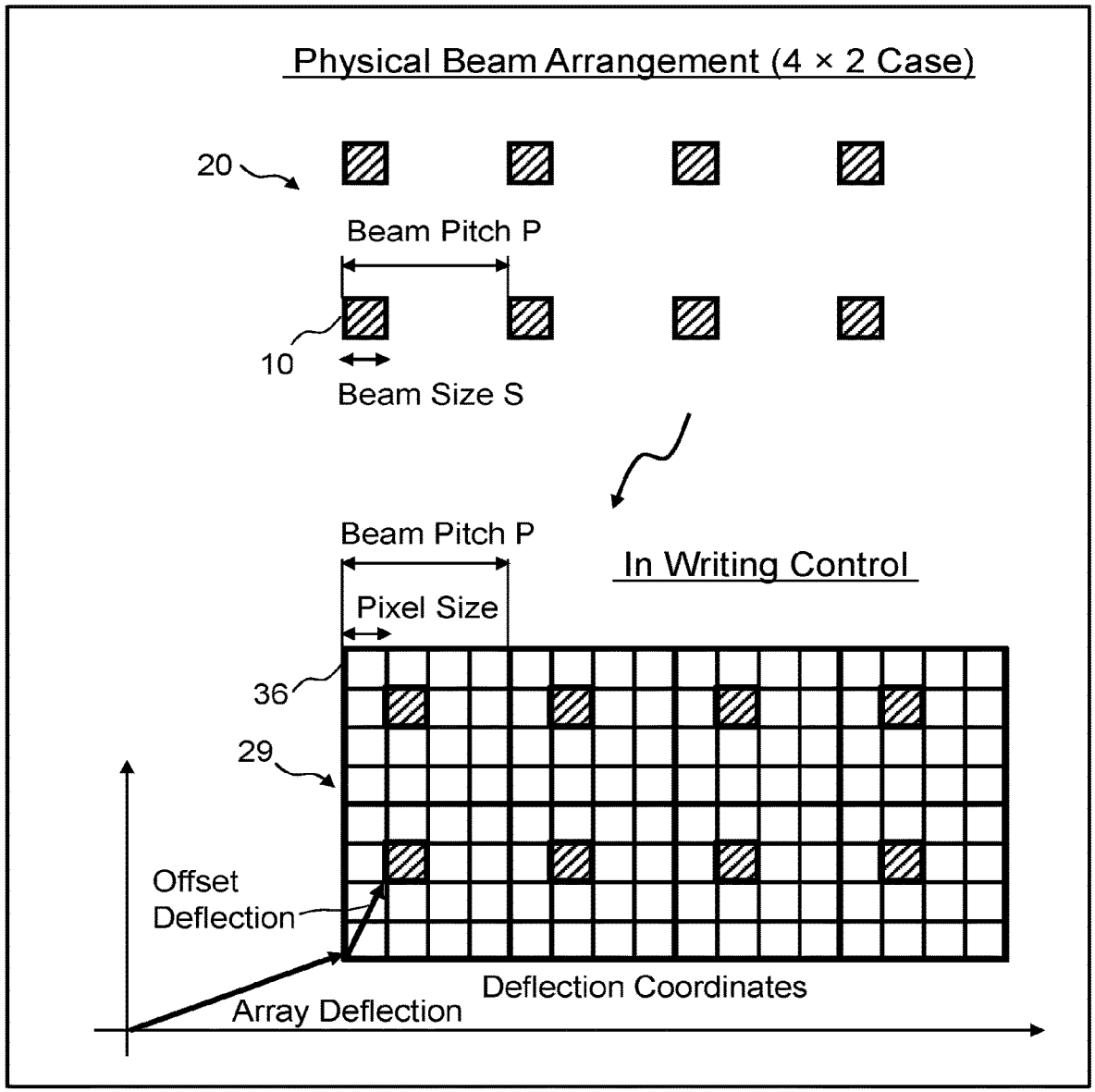
FIG. 9 illustrates an example of a method for controlling a beam position of multiple beams according to the first embodiment.

FIG. 9 illustrates an example of a method for controlling a beam position of multiple beams according to the first embodiment. FIG. 9 shows 4×2 beams 10, in the multiple beams 20, each of which has a predetermined beam size and is arranged at a beam pitch P, for example. According to the first embodiment, when controlling the beam position of the multiple beams 20, the position of each beam is controlled by group of array deflection which the main deflector 208 performs collectively and offset deflection which the sub deflector 209 performs collectively. Thus, both the main deflector 208 and the sub deflector 209 deflect all the multiple beams 20 collectively. An array deflection amount indicates an amount of deflection to the origin of one of the pitch cells 29. An offset deflection amount indicates an amount of deflection from the origin of each pitch cell 29 to a pixel actually exposed. FIG. 9 shows the case where each pitch cell 29 is composed of 4×4 pixels 36, for example. In the case of FIG. 9, as offset deflection, each beam 10 is deflected to the pixel 36 which is the second pixel in the x direction and the third pixel in the y direction.

Figure 10:
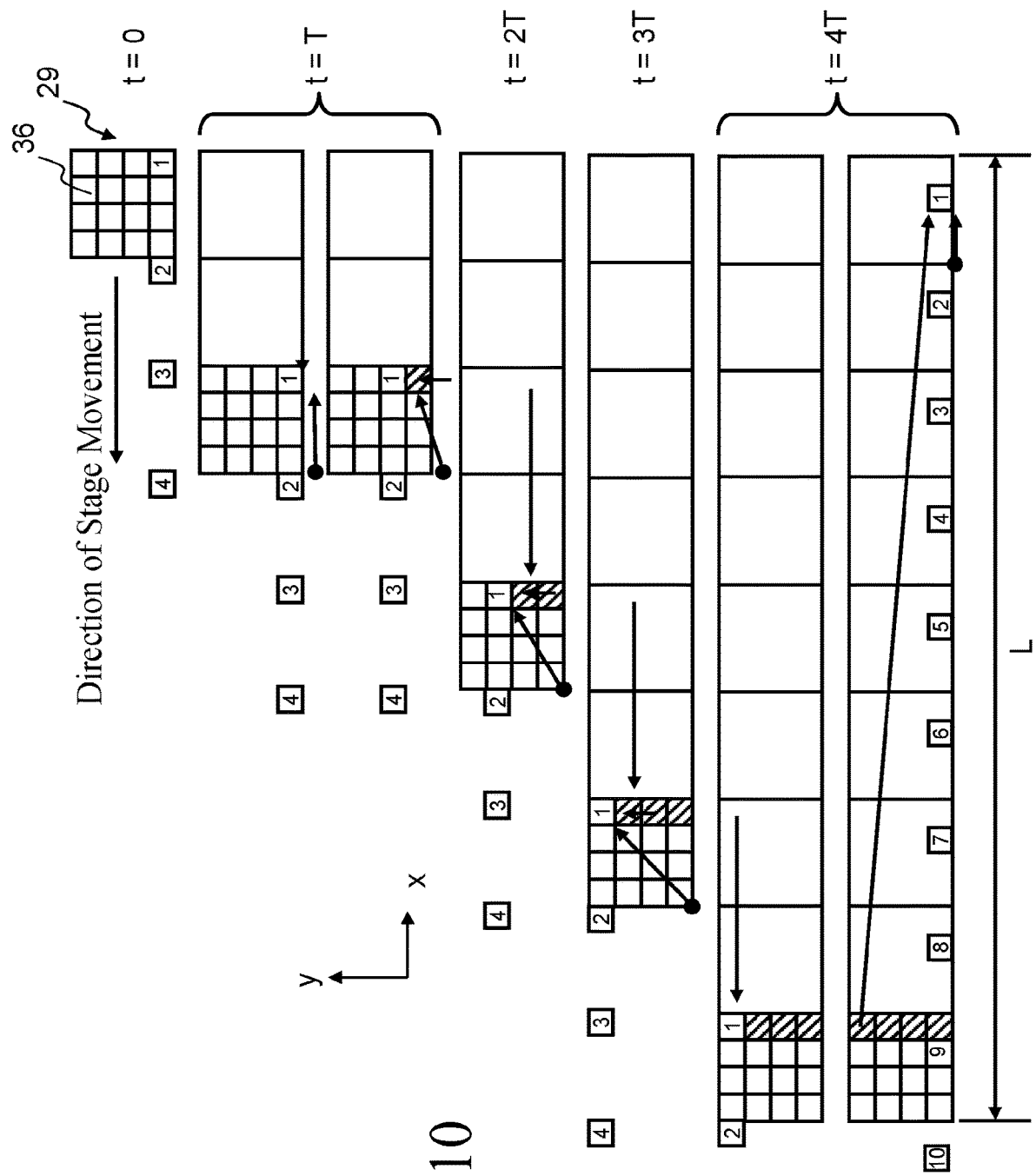
FIG. 10 illustrates an example of a deflection sequence of multiple beams according to the first embodiment.

FIG. 10 illustrates an example of a deflection sequence of multiple beams according to the first embodiment. FIG. 10 shows a portion of a plurality of pitch cells 29 to be written by each of 32×32 multiple beams, for example. In the case of FIG. 10, while the XY stage 105 moves the distance of eight beam pitches, four pixels in the same pitch cell 29 are written (exposed), shifting the irradiation position (pixel 36) in order by offset deflection by the sub deflector 209, for example. The pixel 36 to be exposed is shifted in order every shot cycle T obtained by adding the maximum irradiation time Ttr during which one shot of the multiple beams 20 can perform irradiation, and a sub deflection settling time. For example, the maximum irradiation time Ttr is set to a time greater than the maximum of the irradiation time during which each pixel 36 in the writing region is irradiated with one shot. The sub deflection settling time is a settling time of the DAC amplifier unit 132 for the sub deflector 209. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all the multiple beams 20 by array deflection by the main deflector 208. In other words, tracking control is performed. In the case of FIG. 10, one tracking cycle is executed by writing (exposing) four pixels while the stage moves the distance of eight beam pitches. Other remaining pixels in the pitch cell 29 are written by other beams. After one tracking cycle is completed, tracking is reset to return to the previous (last) tracking starting position by array deflection by the main deflector 208. Since writing of the pixels in the first column from the right of each pitch cell 29 has been completed, after resetting the tracking, in a next tracking cycle, the sub deflector 209 provides deflection such that the writing position of each corresponding beam is adjusted (shifted) to the second pixel column from the right of each pitch cell 29. In the case of FIG. 10, four pixels in the first column from the right in the pitch cell 29 are written by the beam 1, for example. Next, four pixels in the second column from the right in the pitch cell 29 are written by the beam 9 being away by eight beam pitches. Next, four pixels in the third column from the right in the pitch cell 29 are written by the beam 17 being away by eight beam pitches. Next, four pixels in the fourth column from the right in the pitch cell 29 are written by the beam 25 being away by eight beam pitches. Thereby, all the pixels (4×4 pixels) in the object pitch cell 29 have been written. Similarly, other pitch cells 29 are written by a plurality of beams. By repeating this operation during writing the stripe region 32, as shown in FIG. 7, the position of the irradiation region 34 is shifted one by one, such as from 34a to 34o, to perform writing of the stripe region 32 concerned. In order to write the entire writing region without any omission, required is a deflection sequence for performing a complicated deflection control as described above.

For example, if the pixel size in the pitch cell 29 composed of 4×4 pixels 36 is changed, the writing sequence described above usually cannot be used as it is for exposing all the pixels 36 in the stripe region 32. For example, when the pixel size in the pitch cell 29 composed of 4×4 pixels 36 is changed (reduced) to be composed of 5×5 pixels 35 in order to emphasize writing accuracy, if the writing sequence described above is used as it is, it results in there being an unexposed pixel which has not been irradiated by beams. Also, in all the multiple beams loaded, if a beam array to be used is limited in order to emphasize writing accuracy, the writing sequence described above usually cannot be used as it is. For example, when aberration of the optical system is large at the right end of a beam array, if the first column from the right in the beam array is set to be unused and the number of beams in the x direction is limited to thirty-one from thirty-two, it results in there being an unexposed pixel which has not been irradiated by beams. Moreover, if the number of pixels to be exposed in each tracking control is changed, it also results in there being an unexposed pixel which has not been irradiated by beams. Therefore, it becomes necessary to reconstruct the deflection sequence each time to be corresponding to the pixel size to be used and/or the beam array, etc. to be used. However, it is not easy to find a deflection sequence capable of writing the entire writing region on the target object surface while responding to change of the conditions. Thus, if the deflection sequence can be defined by the same format under any conditions, it becomes easy to find a deflection sequence which can respond to respective conditions. Then, according to the first embodiment, by inputting basic parameters, as given optional conditions required by the user, such as a designation value for designating the number of pixels to be exposed, a pixel size, a beam size, and a beam array to be used in one tracking control, the deflection sequence can be defined by the same format even under different conditions.

Figure 11:
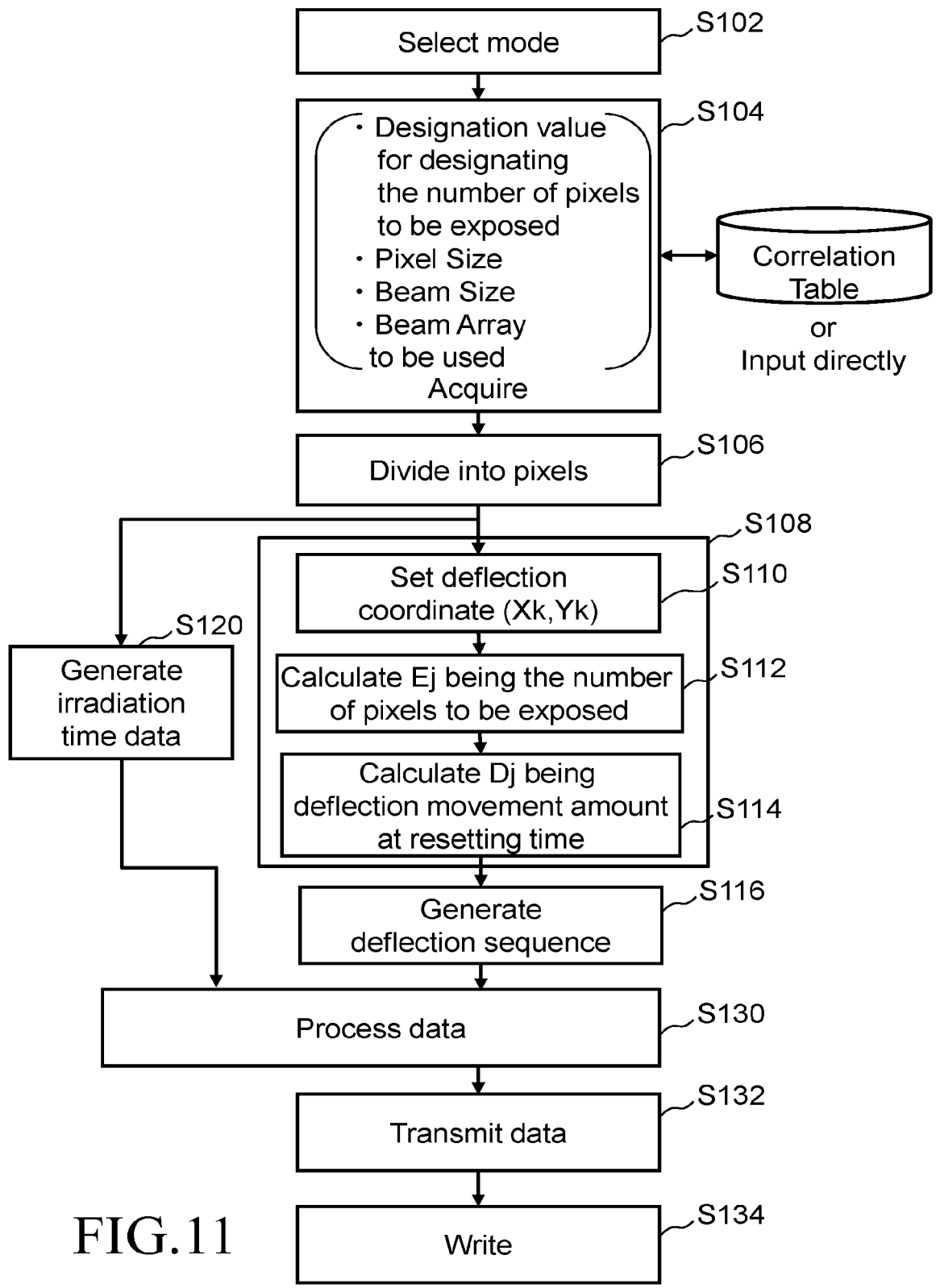
FIG. 11 is a flowchart showing an example of main steps of a writing method according to the first embodiment.

FIG. 11 is a flowchart showing an example of main steps of a writing method according to the first embodiment. In FIG. 11, the writing method of the first embodiment executes a series of steps: a mode selection step (S102), a basic parameter acquisition step (S104), a pixel division step (S106), a parameter acquisition step (S108), a deflection sequence generation step (S116), an irradiation time data generation step (S120), a data processing step (S130), a data transmission step (S132), and a writing step (S134). The parameter acquisition step (S108) executes a series of steps as internal steps: a deflection coordinate setting step (S110), an exposure pixel number calculation step (S112), and a reset time deflection movement amount calculation step (S114).

In the mode selection step (S102), the mode selection unit 50 (selection unit) selects one writing mode from a plurality of writing modes. For example, the mode selection unit 50 selects one of the high accuracy writing mode for writing highly accurately and the high speed writing mode for writing at high speed. It is also preferable to add, in the plurality of writing modes, a standard mode which is between the high accuracy writing mode and the high speed writing mode.

In the basic parameter acquisition step (S104), the basic parameter acquisition unit 52 (parameter acquisition unit) acquires a variable pixel size s, and beam array information defining a beam array to be used for exposure. Specifically, with reference to the correlation table stored in the storage device 144, the basic parameter acquisition unit 52 acquires a designation value M for designating the number of pixels to be exposed according to a selected writing mode, and a pixel size s, and furthermore, a beam size S and a beam array to be used which are beam array information.

Figure 12A:
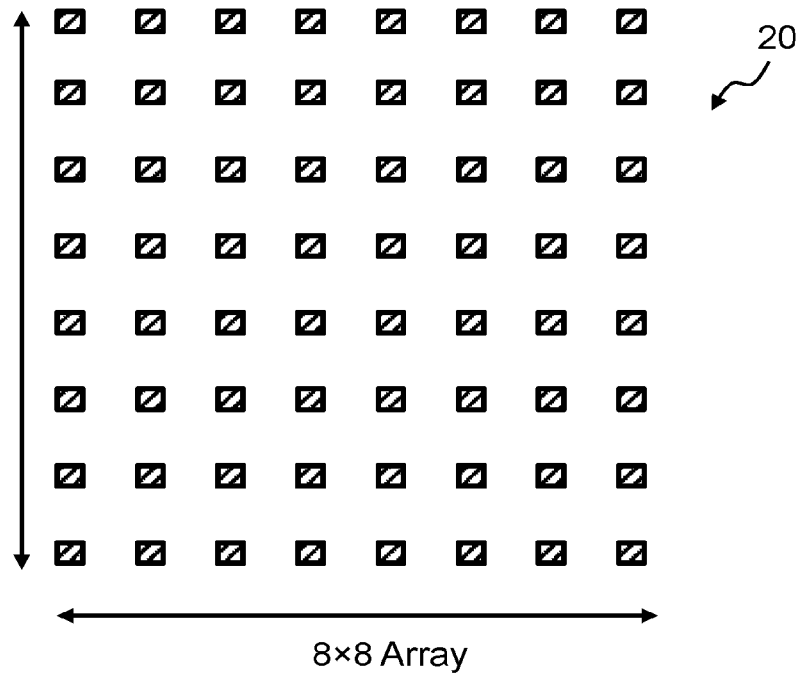
FIGS. 12A and 12B show examples of a beam array used according to the first embodiment.
Figure 12B:
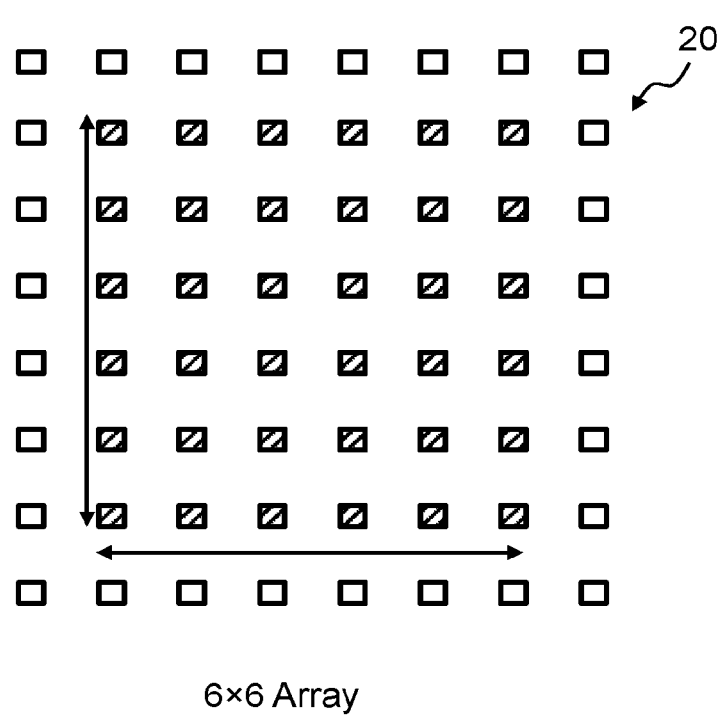

FIGS. 12A and 12B show examples of a beam array used according to the first embodiment. FIG. 12A shows the case where the multiple beams 20, which the electron beam column 102 (irradiation mechanism) mounted in the writing apparatus 100 can emit, compose an array of 8×8 beams. In the case of emphasizing high speed writing, since the number of pixels to be exposed at a time is large, a beam array composed of beams as many as possible is used. However, in proportion as beams are far from the center beam, the beam irradiation position accuracy, the beam shape, and the like are deteriorated because of the influence of aberration (e.g., image distortion and/or field curvature), etc. resulting from the electron optical system, for example. Therefore, when emphasizing writing accuracy, only the beam array at the central part except for beams at the peripheral part is used in the entire multiple beams 20. FIG. 12B shows the case where the beam array composed of 6×6 beams, which is except for the beams at the peripheral part, is used in the beam array of 8×8 beams.

FIGS. 13A to 13D each illustrates a relation between a beam array and a pixel when a pixel size, a beam size, and the number of beams are varied according to the first embodiment. FIG. 13A shows the case, as a basic mode, where four beams are arrayed in the movement direction (x direction) of the XY stage, and each pitch cell 29 is divided into 2×2 pixels 36, for example. In such a case, the whole of pitch cells 29 in the x direction, each composed of 2×2 pixels 36, is written by four beams arrayed in the x direction. The number of beams in the direction (y direction) orthogonal to the movement direction of the XY stage is not herein described.

Moreover, in the case of emphasizing high speed writing, the fewer the number of pixels in each pitch cell 29, the faster the exposure can be performed. On the other hand, when emphasizing writing accuracy, the more the number of pixels in each pitch cell 29, the more averaging is performed for exposure errors, such as beam position variability and beam current variability, which is preferable. Therefore, the number of pixels in the pitch cell 29 is increased by reducing the pixel size. FIG. 13B shows the case where each pitch cell 29 of 2×2 pixels 36 is divided into 3×3 pixels 36 by way of reducing the pixel size. Therefore, when reducing the pixel size, it is needed to set the pixel size to be 1/n (n=integer) of the beam pitch (the size of the pitch cell 29). In such a case, the whole of pitch cells 29 in the x direction, each composed of 3×3 pixels 36, is written by four beams arrayed in the x direction.

FIG. 13B shows the case where the beam size is reduced in proportion as the pixel size has been reduced. However, it is not limited thereto. It is also acceptable to keep the beam size large without changing even if the pixel size has been reduced as shown in the example of FIG. 13C. Thus, as shown in FIGS. 13B and 13C, by keeping the beam pitch unchanged regardless of the beam size, it becomes possible to exclude the beam size from the conditions of deflection control.

Figure 14:
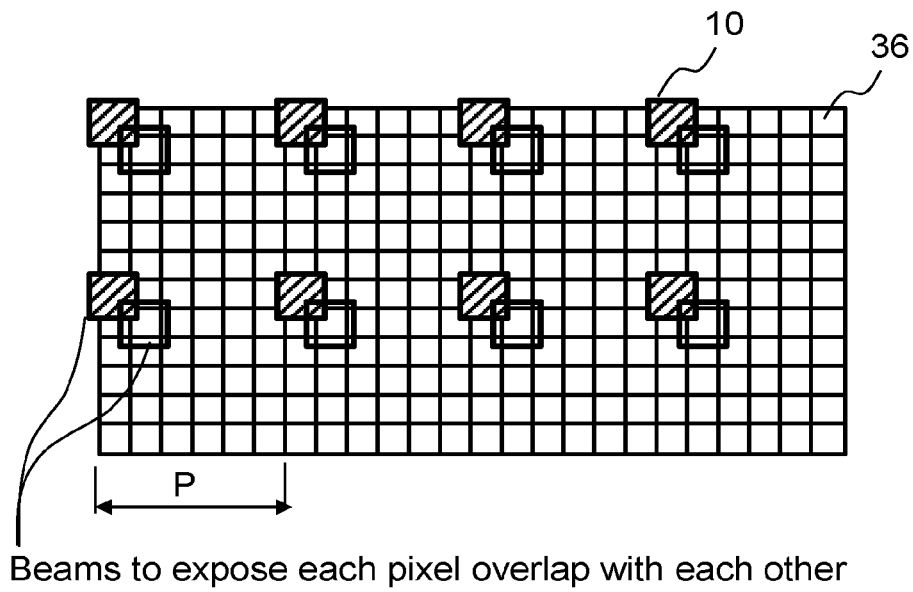
FIG. 14 illustrates an exposed state when the pixel size is smaller than the beam size according to the first embodiment.

FIG. 14 illustrates an exposed state when the pixel size is smaller than the beam size according to the first embodiment.

Figure 15:
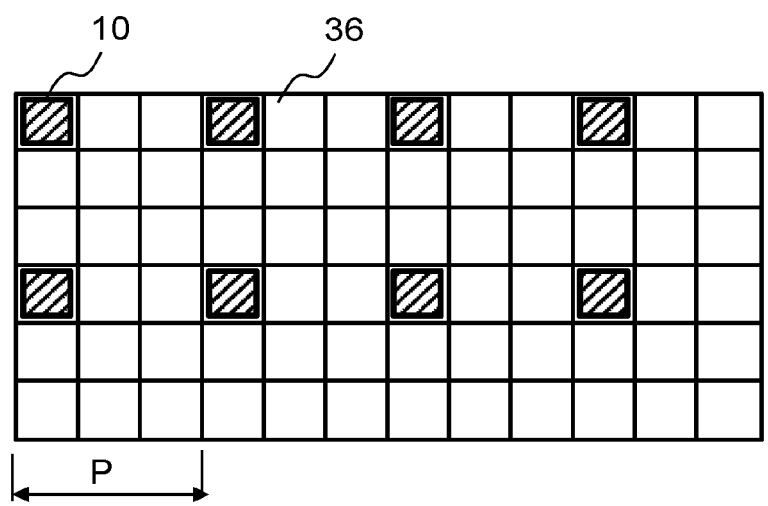
FIG. 15 illustrates an exposed state when the pixel size is larger than the beam size according to the first embodiment.

FIG. 15 illustrates an exposed state when the pixel size is larger than the beam size according to the first embodiment. As shown in FIG. 14, when the pixel size is smaller than the beam size, the beams 10 to expose, that is exposing beams, overlap with each other at adjacent pixels. On the other hand, as shown in FIG. 15, when the pixel size is larger than the beam size, the exposing beam 10 does not irradiate inside the pixel wholly. However, if each of the pixel size and the beam size is smaller than the distance of the irradiation diffusion effect (blurring) of the resist, even when a space or overlapping exists between regions exposed by respective beams due to a difference between the pixel size and the beam size, the space or overlapping at the portion exposed by multiple beams does not affect the writing accuracy greatly. In any case, the exposure time should be controlled so that the dose per pixel may be consistent with a required amount. Accordingly, dose change accompanied by beam size change can be controlled by adjustment of the irradiation time. Therefore, the pixel size does not need to be consistent with the beam size.

As described above, when emphasizing high speed writing, the more beams the better, and when emphasizing writing accuracy, it is desirable to reduce the number of beams and to limit for using only beams at the central portion in a beam array except for beams at the peripheral portion with large aberration, for example. FIG. 13D shows the case where the number of beams in the movement direction (x direction) of the XY stage is changed to three from four. In that case, the whole of pitch cells 29 in the x direction, each composed of 2×2 pixels 36, is written by three beams arrayed in the x direction.

FIG. 16 shows an example of a correlation table of writing modes and basic parameters according to the first embodiment. In the correlation table, according to a plurality of writing modes, there are variably defined a designation value M for designating the number of pixels to be exposed during each tracking control period, a pixel size s, and identification information (b×c) for identifying a beam array to be used for exposure in the multiple beams 20 whose beam pitch P (pitch between beams) has been set at least during writing the writing region. In the correlation table shown in the example of FIG. 16, using values which satisfy the relation M1>M2>M3, the value M designating the number of pixels to be exposed during each tracking control is defined to be M1 when in the high speed writing mode, M3 when in the high accuracy writing mode, and M2, being a middle value, when in the standard writing mode. Moreover, in the correlation table, using values which satisfy the relation s1>s2, the pixel size s is defined to be s1 when in the high speed writing mode, s2 when in the high accuracy writing mode, and s1 when in the standard writing mode. Moreover, in the correlation table, using values which satisfy the relation S1>S2, the beam size S is defined to be S1 when in the high speed writing mode, S2 when in the high accuracy writing mode, and S1 when in the standard writing mode. Moreover, in the correlation table, using values which satisfy the relation b1>b2 and c1>c2, the identification information b×c on the beam array to use is defined to be the beam array of b1×c1 when in the high speed writing mode, the beam array of b2×c2 when in the high accuracy writing mode, and the beam array of b1×c1 when in the standard writing mode. The beam array to use is defined on the premise that the beam array at the central portion is used. Each value may be defined beforehand in the correlation table, according to the array of beams which the electron beam column 102 of the writing apparatus 100 can emit, and to the size of beam pitch on the target object 101.

Although the case where, according to a selected writing mode, each value defined in the correlation table is used as a basic parameter has been described above, it is not limited thereto. For example, it is also preferable that the basic parameter acquisition unit 52 acquires each value which the user directly inputs as a basic parameter through input means, such as a GUI (graphic user interface) (not shown).

In the pixel division step (S106), the pixel division unit 54 (division unit) divides the stripe region 32 (writing region) on the target object 101 surface to be irradiated with the multiple beams 20 into a plurality of pixels 36 (pixel region) by the pixel size which varies according to a selected writing mode. Specifically, for example, the stripe region 32 is divided into a plurality of pixels 36 (pixel region) by an acquired pixel size s, such as the pixel size based on which the inside of each pitch cell 29 becomes composed of 2×2 pixels 36. Alternatively, for example, the stripe region 32 is divided into a plurality of pixels 36 (pixel region) by the pixel size based on which the inside of each pitch cell 29 becomes composed of 3×3 pixels 36. Thereby, a plurality of pixels 36 to be exposed by each of the multiple beams 20 are set based on the size according to a writing mode.

In the parameter acquisition step (S108), the parameter acquisition unit 55 (acquisition unit) acquires, based on the pixel size and the beam array information, a plurality of deflection coordinates (Xk, Yk) for deflecting the beam concerned to a plurality of pixels 36 in each pitch cell 29, "Ej" being the number of pixels, in each pitch cell 29, to be exposed by a beam during each tracking control performed so that the multiple beams 20 may collectively follow the movement of the XY stage 105, and a deflection movement amount "Dj" of multiple beams at the time of tracking reset for resetting the tracking starting position after a tracking control period has passed. The following internal steps are carried out for acquiring deflection sequence parameters, such as the plurality of deflection coordinates (Xk, Yk), the number of pixels to be exposed "Ej", and the deflection movement amount "Dj".

In the deflection coordinate setting step (S110), with reference to the correlation table, the deflection coordinate setting unit 60 sets a plurality of deflection coordinates (Xk, Yk) to a plurality of pixels 36 obtained by dividing the stripe region 32 (writing region) by the pixel size s defined for a selected writing mode. The size of the beam pitch in the x direction and that of the beam pitch in the y direction may be the same or different from each other. As the plurality of deflection coordinates, there exist deflection coordinates whose number is equivalent to the number of pixels in the pitch cell 29 (rectangular, including square, region) having the width of the beam pitch in the x direction and the length of the beam pitch in the y direction. If the beam pitch in the x direction and the beam pitch in the y direction are the same as each other, there exist deflection coordinates, as the plurality of deflection coordinates, whose number is equivalent to the squared value of m, that is $m^2$, where m is the number of a plurality of pixels 36 arrayed in one direction (x direction) such that the total length of the sizes of the pixels 36 is the beam pitch P (beam pitch size). Description is given below exemplifying that the beam pitch in the x direction and the beam pitch in the y direction are the same as each other. A plurality of deflection coordinates (Xk, Yk) are set for each pitch cell 29. When the inside of each pitch cell 29 is divided, for example, into 2×2 pixels 36, four ($2^2$) deflection coordinates of (0, 0), (0, 1), (1, 0), and (1, 1) are set to the reference positions of the 2×2 pixels 36. When the inside of each pitch cell 29 is divided, for example, into 3×3 pixels 36, nine ($3^2$) deflection coordinates of (0, 0), (0, 1), (0, 2), (1, 0), (1, 1), (1, 2), (2, 0), (2, 1), and (2, 2) are set to the reference positions of the 3×3 pixels 36. It is preferable to use, for example, the lower left corner of each pixel 36 as the reference position of the pixel 36. Alternatively, it is also preferable to use the center position of each pixel 36. In the deflection sequence according to the first embodiment, squared value ($m^2$) time exposures, which are exposures performed squared value times by a series of beam deflections to each of the plurality of deflection coordinates (Xk, Yk) and defined as one cycle, are performed being divided into a plurality of tracking control periods.

Figure 17:
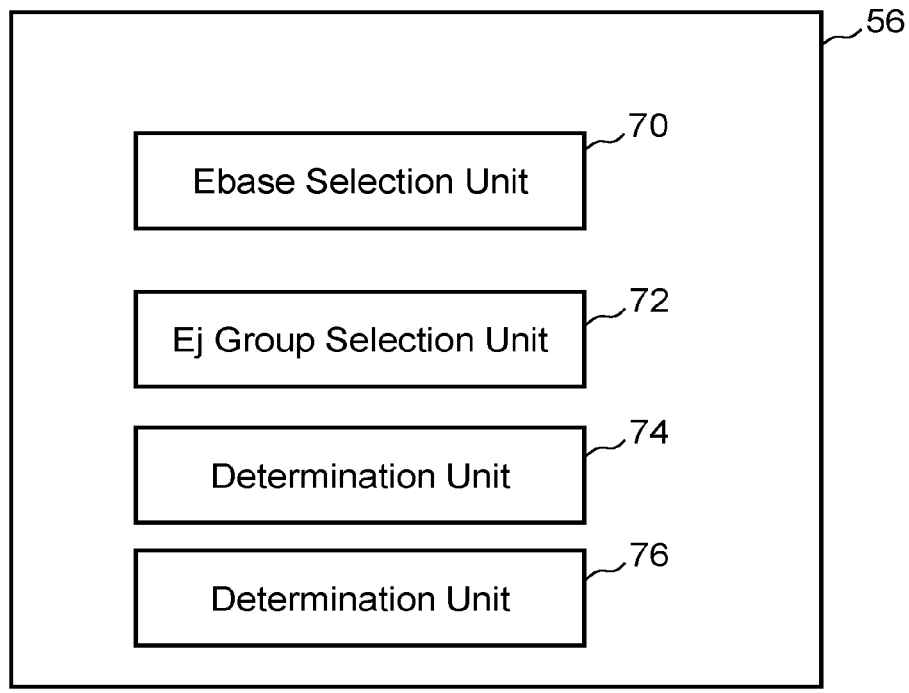
FIG. 17 shows an internal configuration of an exposure pixel number calculation unit according to the first embodiment.

FIG. 17 shows an internal configuration of an exposure pixel number calculation unit according to the first embodiment. In FIG. 17, in the exposure pixel number "Ej" calculation unit 56, there are arranged a reference pixel number "Ebase" selection unit 70, an exposure pixel number "Ej" group selection unit 72, and determination units 74 and 76. Each of the "units" such as the reference pixel number "Ebase" selection unit 70, the exposure pixel number "Ej" group selection unit 72, and the determination units 74 and 76 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Information input/output to/from the reference pixel number "Ebase" selection unit 70, the exposure pixel number "Ej" group selection unit 72, and the determination units 74 and 76, and information being operated are stored in the memory 112 each time.

Figure 18:
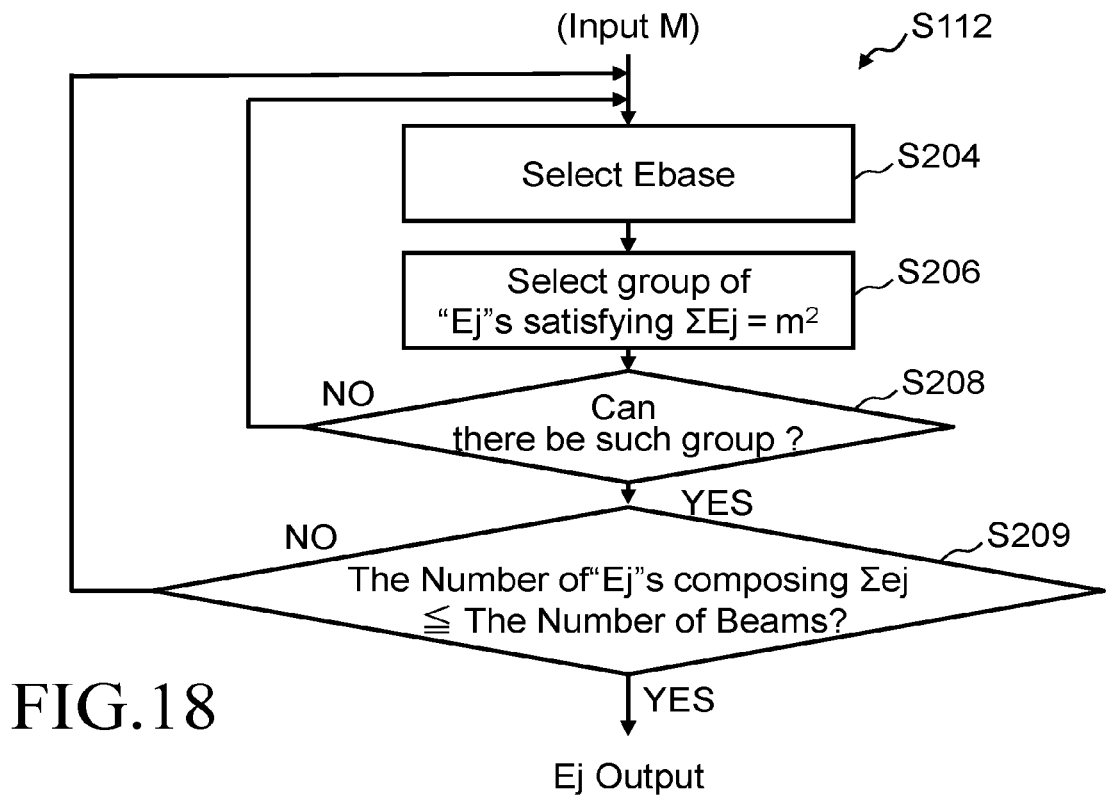
FIG. 18 is a flowchart showing an example of an internal step of an exposure pixel number calculation step according to the first embodiment.

In the exposure pixel number calculation step (S112), with reference to a correlation table, the exposure pixel number "Ej" calculation unit 56 calculates "Ej" being the number of pixels to be exposed during each tracking control period, using a designation value M for designating the number of pixels defined for a selected writing mode. Defining, as one cycle, squared value ($m^2$) time exposures which are exposures performed squared value times by a series of beam deflections to each of a plurality of set deflection coordinates (Xk, Yk) as described above, the exposure pixel number "Ej" calculation unit 56 calculates "Ej", being the number of pixels to be exposed during each tracking control, such that the total of "Ej"s in one cycle is coincide with the squared value ($m^2$). Specifically, it operates as follows:

FIG. 18 is a flowchart showing an example of an internal step of an exposure pixel number calculation step according to the first embodiment. In FIG. 18, the exposure pixel number calculation step (S112) according to the first embodiment executes a series of steps, as internal steps: a reference pixel number "Ebase" selection step (S204), an exposure pixel number "Ej" group selection step (S206), a determination step (S208), and a determination step (S209).

In the reference pixel number "Ebase" selection step (S204), first, the reference pixel number "Ebase" selection unit 70 inputs a designation value M for designating the number of pixels to be exposed which is defined for a selected writing mode, and selects a reference pixel number "Ebase" based on the designation value M. Then, the reference pixel number "Ebase" selection unit 70 selects the exposure pixel number designation value M, as the reference pixel number "Ebase". For example, the reference pixel number "Ebase" selection unit 70 inputs an exposure pixel designation value M=2, and selects a reference pixel number Ebase=2.

In the exposure pixel number "Ej" group selection step (S206), the exposure pixel number "Ej" group selection unit 72 selects a group of "Ej"s, each of which is the number of pixels to be exposed, such that ΣEj being the total of grouped exposure pixel number "Ej"s is coincide with $m^2$ being the squared value of m which is the number of a plurality of pixels 36 arrayed in the x direction. When the reference pixel number "Ebase" is equal to 2, two pixels per tracking control are to be exposed with respect to nine pixels (in the case of m=3, for example). However, if only 2 is used, it is impossible to obtain 9 as a total by using a group composed of 2 only.

In the determination step (S208), the determination unit 74 determines, using a selected reference pixel number "Ebase", whether there can be a group of "Ej"s, each being the number of pixels to be exposed, such that the total of the grouped "Ej"s is consistent with $m^2$. In the case described above, when the reference pixel number "Ebase" is equal to 2, it is impossible to have a grouped "Ej"s satisfying nine pixels. When impossible, it returns to the reference pixel number "Ebase" selection step (S204). When possible, it goes to the determination step (S209).

After returning to the reference pixel number "Ebase" selection step (S204), the reference pixel number "Ebase" selection unit 70 selects M and M−1 as the reference pixel number "Ebase"s. In the exposure pixel number "Ej" group selection step (S206), the exposure pixel number "Ej" group selection unit 72 selects, using M and M−1, a group of exposure pixel number "Ej"s which is equal to $m^2$ (in the case of m=3, for example). In the case of M=2, using 2 and 1, it is possible to select a group of "Ej"s of 2, 2, 2, 2, 1. Consequently, in the determination step (S208), the determination unit 74 determines that there can be a group of exposure pixel number "Ej"s which satisfies that the total of the grouped "Ej"s is equal to $m^2$ (in the case of m=3, for example). Then, it goes to the determination step (S209).

In the determination step (S209), the determination unit 76 determines whether the number of exposure pixel number "Ej"s composing a group is less than or equal to b which is the number of beams. The determination unit 76 inputs identification information (b×c) of a beam array having been set for a selected writing mode, and performs determination using b being the number of beams arrayed in the movement direction (x direction) of the XY stage 105. For example, when the number of beams arrayed in the movement direction (x direction) of the XY stage 105 is four, the number of exposure pixel number "Ej"s composing a group is five, namely 2, 2, 2, 2, 1, which is larger than 4=b being the number of beams. Therefore, the group of "Ej"s of 2, 2, 2, 2, 1 cannot be used. When the number of exposure pixel number "Ej"s composing a group is not less than or equal to b being the number of beams, it returns to the reference pixel number "Ebase" selection step (S204). When the number of exposure pixel number "Ej"s composing a group is less than or equal to b being the number of beams, it goes to the reset time deflection movement amount calculation step (S114).

After returning to the reference pixel number "Ebase" selection step (S204), the reference pixel number "Ebase" selection unit 70 selects M and M+1 as the reference pixel number "Ebase"s. In the exposure pixel number "Ej" group selection step (S206), the exposure pixel number "Ej" group selection unit 72 selects, using M and M+1, a group of exposure pixel number "Ej"s which is equal to $m^2$. In the case of M=2, using 2 and 3, it is possible to select a group of "Ej"s of 3, 2, 2, 2. Consequently, in the determination step (S208), the determination unit 74 determines that there can be a group of exposure pixel number "Ej"s which satisfies that the total of the grouped "Ej"s is equal to $m^2$ (in the case of m=3, for example). Then, it goes to the determination step (S209). In the determination step (S209), the determination unit 76 determines whether the number of exposure pixel number "Ej"s composing a group is less than or equal to b which is the number of beams. The number of exposure pixel number "Ej"s composing a group is four, namely 3, 2, 2, 2, which is less than or equal to 4=b being the number of beams. Therefore, the group of the exposure pixel number "Ej"s of 3, 2, 2, 2 can be set and used.

Figure 19:
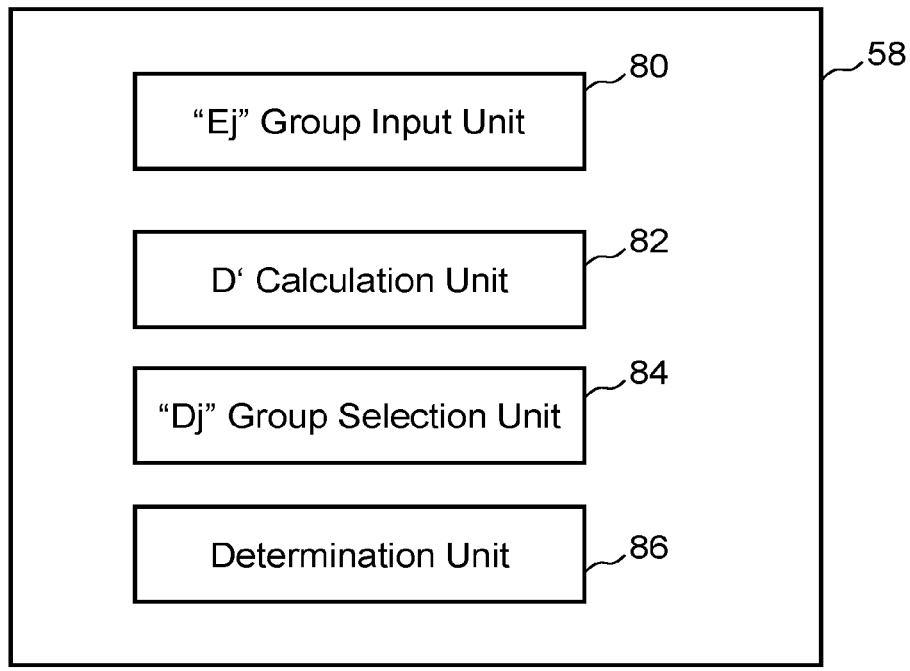
FIG. 19 shows an internal configuration of a deflection movement amount calculation unit according to the first embodiment.

FIG. 19 shows an internal configuration of a deflection movement amount calculation unit according to the first embodiment. In FIG. 19, in the deflection movement amount "Dj" calculation unit 58, there are arranged an exposure pixel number "Ej" group input unit 80, a temporary movement amount D' calculation unit 82, a deflection movement amount "Dj" group selection unit 84, and a determination unit 86. Each of the " . . . units" such as the exposure pixel number "Ej" group input unit 80, the temporary movement amount D' calculation unit 82, the deflection movement amount "Dj" group selection unit 84, and the determination unit 86 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the exposure pixel number "Ej" group input unit 80, the temporary movement amount D' calculation unit 82, the deflection movement amount "Dj" group selection unit 84, and the determination unit 86, and information being operated are stored in the memory 112 each time.

Figure 20:
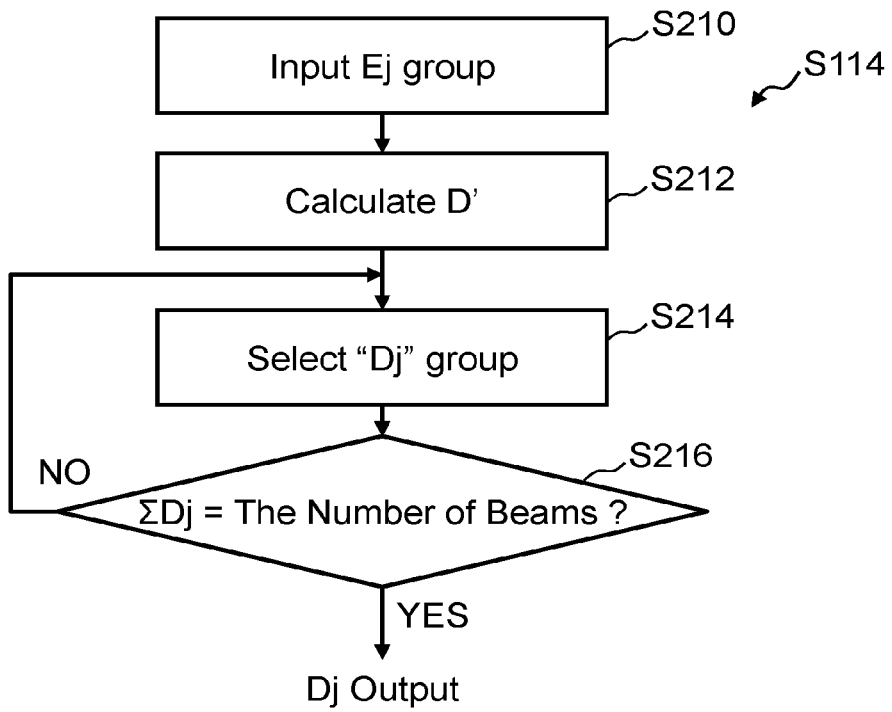
FIG. 20 is a flowchart showing an example of an internal step of a reset time deflection movement amount calculation step according to the first embodiment.

In the reset time deflection movement amount calculation step (S114), with reference to the correlation table, the deflection movement amount "Dj" calculation unit 58 calculates a deflection movement amount "Dj" of the multiple beams 20 deflected at tracking reset time, by using identification information (b×c) for identifying a beam array (beam group), in the multiple beams 20, to be used for exposure and having been defined for a selected writing mode. Defining squared value ($m^2$) time exposures, which are exposures performed squared value times by a series of beam deflections to each of a plurality of set deflection coordinates (Xk, Yk), as one cycle as described above, the deflection movement amount "Dj" calculation unit 58 calculates a deflection movement amount "Dj" of the multiple beams deflected at tracking reset time such that the total of the deflection movement amount "Dj" of the multiple beams 20 deflected at tracking reset time in one cycle is consistent with a value bP obtained by multiplying b being the number of beams of the multiple beams 20 in the movement direction of the XY stage 105 by P being the beam pitch (beam pitch size). Preferably, the deflection movement amount "Dj" is defined using the value k which is used when indicating k (being a natural number) times the beam pitch P (beam pitch size). Specifically, it operates as follows:

FIG. 20 is a flowchart showing an example of an internal step of a reset time deflection movement amount calculation step according to the first embodiment. In FIG. 20, the reset time deflection movement amount calculation step (S114) of the first embodiment executes a series of steps as internal steps: an exposure pixel number Ej group input step (S210), a temporary movement amount D' calculation step (S212), a deflection movement amount "Dj" group selection step (S214), and a determination step (S216).

In the exposure pixel number Ej group input step (S210), the exposure pixel number "Ej" group input unit 80 inputs a calculated exposure pixel number Ej group. In the example described above, information on the group of "Ej"s of 3, 2, 2, 2 is input.

In the temporary movement amount D' calculation step (S212), the temporary movement amount D' calculation unit 82 inputs identification information (b×c) for identifying a beam array (beam group), in the multiple beams 20, to be used for exposure and having been defined for a selected writing mode. Then, the temporary movement amount D' calculation unit 82 calculates a temporary movement amount D' by dividing the value bP by tracking times (the number of times of tracking), where the bP is obtained by multiplying b being the number of beams in the movement direction (x direction) of the XY stage 105 by P being a beam pitch, and where the tracking times is for performing squared value ($m^2$) time exposures (one cycle) by a series of beam deflections to each of a plurality of set deflection coordinates (Xk, Yk). In other words, the temporary movement amount D' calculation unit 82 calculates a temporary movement amount D' as a temporary deflection movement amount of the multiple beams 20 in one tracking reset. For convenience, without using the value bP obtained by multiplying the beam pitch P by b being the number of beams, a temporary movement amount D' is calculated by dividing the value b obtained by dividing dP by the beam pitch, where b is used instead of the distance bP, by the number of times of tracking. The number of times of tracking in one cycle is the same as the number of exposure pixel number "Ej"s composing a group. Thus, the temporary movement amount D' calculation unit 82 calculates a temporary movement amount D' by dividing b being the number of beams in the movement direction (x direction) of the XY stage 105 by the number of exposure pixel number "Ej"s composing a group. For example, when the number of beams of the multiple beams 20 in the x direction is four, and the number of exposure pixel number "Ej"s composing a group is three, the temporary movement amount D' is 1.33(=4/3). For example, when the number of beams of the multiple beams 20 in the x direction is four, and the number of exposure pixel number "Ej"s composing a group is four, the temporary movement amount D' is 1(=4/4).

In the deflection movement amount "Dj" group selection step (S214), the deflection movement amount "Dj" group selection unit 84 selects a group of deflection movement amount "Dj"s, based on the temporary movement amount D'. When selecting the number of deflection movement amount "Dj"s composing a group, it is selected such that the number of "Dj"s is the same as the number of times of tracking for performing one cycle. For example, when the number of times of tracking for performing one cycle is three times (the number of exposure pixel number "Ej"s composing a group is three), and the temporary movement amount D'=1.33, the deflection movement amount "Dj" group selection unit 84 selects, as the deflection movement amount "Dj", "Dj"s of 2, 2, 1, using integers 1 and 2 having 1.33 therebetween. For example, when the number of tracking for performing one cycle is four times (the number of exposure pixel number "Ej"s composing a group is four), and the temporary movement amount D'=1, the deflection movement amount "Dj" group selection unit 84 selects, as the deflection movement amount "Dj", "Dj"s of 1, 1, 1, 1, using integer 1.

In the determination step (S216), the determination unit 86 determines whether ΣDj being the total of deflection movement amount "Dj"s is consistent with the value bP obtained by multiplying b being the number of beams of the multiple beams 20 by the beam pitch P. When the deflection movement amount "Dj" is defined using the value k which is used when indicating k (being a natural number) times the beam pitch P (beam pitch size), the determination unit 86 determines whether ΣDj being the total of deflection movement amount "Dj"s is consistent with b being the number of beams in the x direction. It is here described the case where the deflection movement amount "Dj" is defined using the value k which is used when indicating k (being a natural number) times the beam pitch P (beam pitch size). For example, when b being the number of beams is four, ΣDj being the total of deflection movement amount "Dj"s of 2, 2, 1 is five, thereby determining that they are not consistent with each other. For example, when b being the number of beams is four, ΣDj being the total of deflection movement amount "Dj"s of 1, 1, 1, 1 is four, thereby determining that they are not consistent with each other. For example, when b being the number of beams of the multiple beams 20 in the x direction is three, ΣDj being the total of deflection movement amount "Dj"s of 2, 1, 2 is five, thereby determining that they are not consistent with each other. For example, when b being the number of beams of the multiple beams 20 in the x direction is three, ΣDj being the total of deflection movement amount "Dj"s of 1, 1, 1, 1 is four, thereby determining that they are not consistent with each other. When ΣDj being the total of deflection movement amount "Dj"s is not consistent with b being the number of beams, it returns to the deflection movement amount "Dj" group selection step (S214), and another group is selected. When ΣDj being the total of deflection movement amount "Dj"s is consistent with b being the number of beams, it goes to the deflection sequence generation step (S116).

When ΣDj being the total of deflection movement amount "Dj"s is consistent with b being the number of beams, it returns to the deflection movement amount "Dj" group selection step (S214). Then, the deflection movement amount "Dj" group selection unit 84 selects a group of deflection movement amount "Dj"s, based on the temporary movement amount D'. For example, when the temporary movement amount D'=1.33, the deflection movement amount "Dj" group selection unit 84 selects, as the deflection movement amount "Dj", "Dj"s of 2, 1, 1, using integers 1 and 2 having 1.33 therebetween. In the determination step (S216), the determination unit 86 determines whether ΣDj being the total of deflection movement amount "Dj"s is consistent with b being the number of beams. When b being the number of beams is four, since ΣDj being the total of "Dj"s of 2, 1, 1 is four, it is determined that they are consistent with each other.

As described above, the parameter acquisition unit 55 can acquire deflection sequence parameters.

In the deflection sequence generation step (S116), the deflection sequence generation unit 61 (generation unit) generates a deflection sequence defined using a plurality of deflection coordinates (Xk, Yk), "Ej" being the number of pixels to be exposed during each tracking control period, and a deflection movement amount "Dj" of the multiple beams 20 at the time of tracking reset. In the deflection sequence, the order of deflection of a plurality of deflection coordinates (Xk, Yk) is set such that beams should be deflected, without overlapping, to a plurality of deflection coordinates (Xk, Yk) whose number is equivalent to the squared value of m, that is $m^2$, described above. For example, since the deflection position is shifted while the XY stage 105 is continuously moving, the order of deflection can be set such that priority is given to deflection in the direction (y direction) orthogonal to the movement direction (x direction) of the XY stage 105, in order to preferentially perform exposure for a pixel becoming farther with the movement of the XY stage 105.

Figure 21:
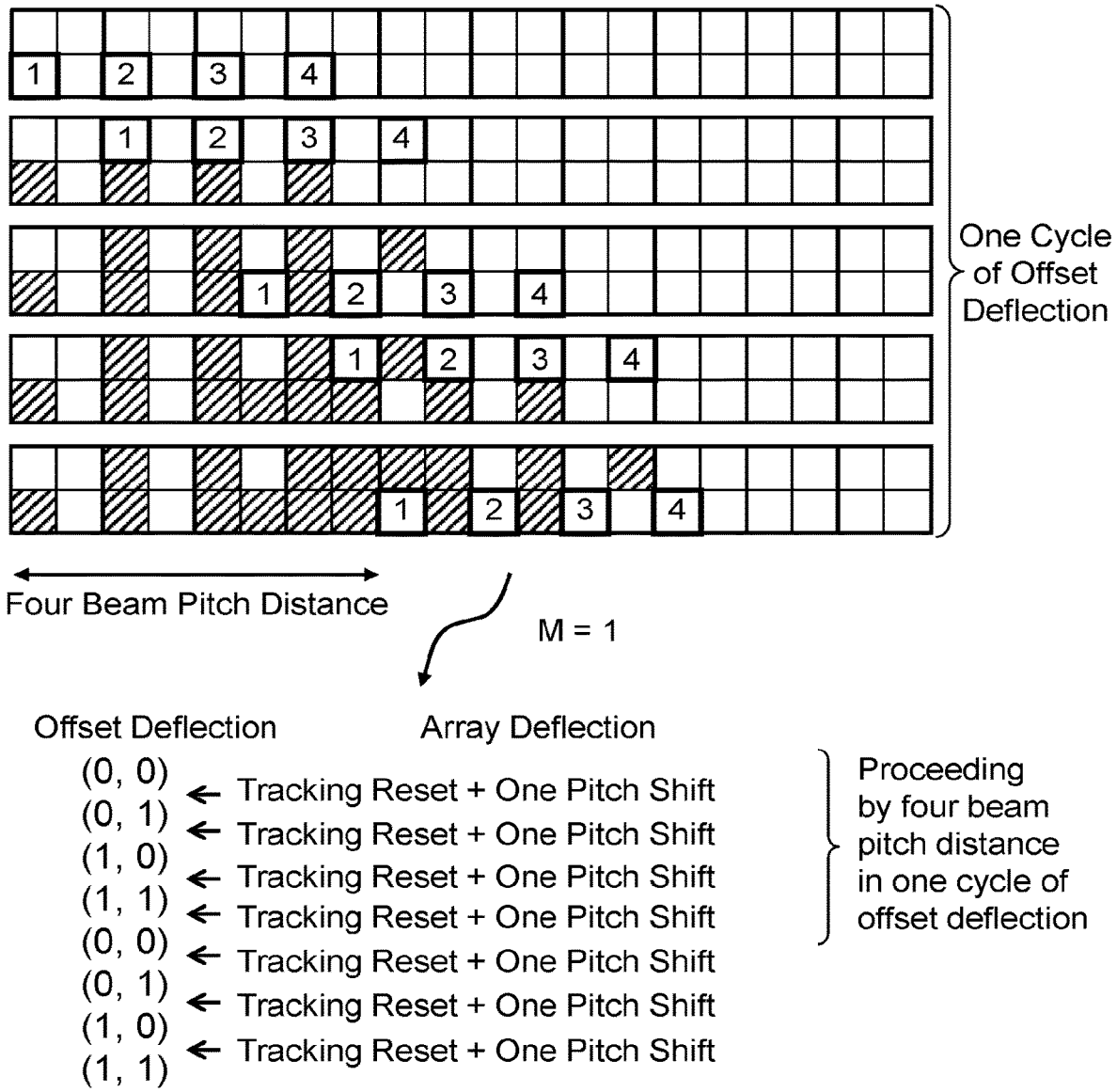
FIG. 21 shows an example of a deflection sequence according to the first embodiment.

FIG. 21 shows an example of a deflection sequence according to the first embodiment. FIG. 21 illustrates the case where b being the number of beams in the movement direction (x direction) of the XY stage 105 is four, each pitch cell 29 is composed of 2×2 pixels 36, and the designation value M for designating the number of pixels to be exposed is one (M=1). Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (1, 0), and (1, 1), and deflection is performed in this order. When the designation value M for designating the number of pixels to be exposed is one (M=1), "Ej" being the number of pixels to be exposed is calculated to be Ej=1, 1, 1, 1 based on the method described above. The deflection movement amount "Dj" is calculated to be Dj=1, 1, 1, 1 based on the method described above. As shown in FIG. 21, at the first shot, an offset deflection is applied to deflection coordinates (0, 0) in each pitch cell 29 and the pixel 36 at the deflection coordinates (0, 0) is exposed by four beams in the x direction. Since E1=1, tracking is reset after the first shot is completed, and since D1=1, the deflection position of the multiple beams 20 is shifted by one beam pitch. At the second shot, the offset deflection position is shifted to the deflection coordinates (0, 1) in each pitch cell 29 and the pixel 36 at the deflection coordinates (0, 1) is exposed by four beams in the x direction. Since E2=1, tracking is reset after the second shot is completed, and since D2=1, the deflection position of the multiple beams 20 is shifted by one beam pitch. At the third shot, the offset deflection position is shifted to the deflection coordinates (1, 0) in each pitch cell 29 and the pixel 36 at the deflection coordinates (1, 0) is exposed by four beams in the x direction. Since E3=1, tracking is reset after the third shot is completed, and since D3=1, the deflection position of the multiple beams 20 is shifted by one beam pitch. At the fourth shot, the offset deflection position is shifted to the deflection coordinates (1, 1) in each pitch cell 29 and the pixel 36 at the deflection coordinates (1, 1) is exposed by four beams in the x direction. Since E4=1, tracking is reset after the fourth shot is completed, and since D4=1, the deflection position of the multiple beams 20 is shifted by one beam pitch. Thereby, exposure of one cycle has been completed. In the pitch cell 29 which the fourth beam exposes at the first shot, all the pixels can be exposed. Thus, in this deflection sequence, per cycle, the deflection position of the multiple beams 20 is shifted by the distance of four beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej" being the number of pixels to be exposed, and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first to third beams at the first shot. Therefore, if the writing processing is started after shifting, by three beam pitches, the position of the irradiation region 34 of the first shot toward the outside of the stripe region 32 and in the movement direction of the XY stage 105, it becomes possible to expose all the pixels 36 in the stripe region 32.

Figure 22:
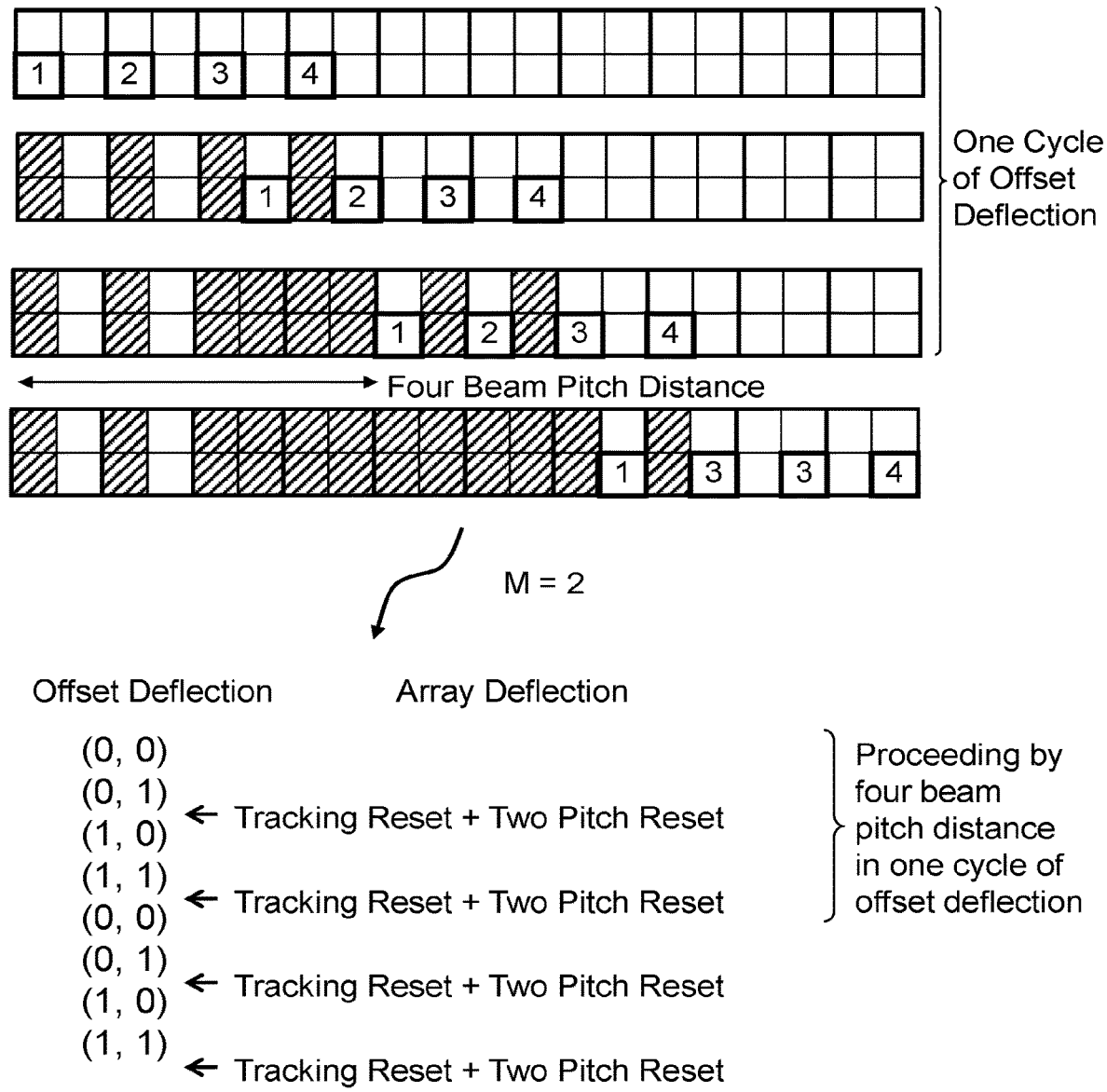
FIG. 22 shows another example of a deflection sequence according to the first embodiment.

FIG. 22 shows another example of a deflection sequence according to the first embodiment. FIG. 22 illustrates the case where b being the number of beams in the movement direction (x direction) of the XY stage 105 is four, each pitch cell 29 is composed of 2×2 pixels 36, and the designation value M for designating the number of pixels to be exposed in each tracking control is two (M=2). The example of FIG. 22 is the case of changing the designation value M of FIG. 21. Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (1, 0), and (1, 1), and deflection is performed in this order. When the designation value M for designating the number of pixels to be exposed is two (M=2), "Ej" being the number of pixels to be exposed is calculated to be Ej=2, 2 based on the method described above. The deflection movement amount "Dj" is calculated to be Dj=2, 2 based on the method described above. As shown in FIG. 22, at the first shot, an offset deflection is applied to deflection coordinates (0, 0) in each pitch cell 29 and the pixel 36 at the deflection coordinates (0, 0) is exposed by four beams in the x direction. Since E1=2, it is followed by the second shot. At the second shot, the offset deflection position is shifted to the deflection coordinates (0, 1) in each pitch cell 29 and the pixel 36 at the deflection coordinates (0, 1) is exposed by four beams in the x direction. Since E1=2, tracking is reset after the second shot is completed, and since D1=2, the deflection position of the multiple beams 20 is shifted by two beam pitches. At the third shot, the offset deflection position is shifted to the deflection coordinates (1, 0) in each pitch cell 29 and the pixel 36 at the deflection coordinates (1, 0) is exposed by four beams in the x direction. Since E2=2, it is followed by the fourth shot. At the fourth shot, the offset deflection position is shifted to the deflection coordinates (1, 1) in each pitch cell 29 and the pixel 36 at the deflection coordinates (1, 1) is exposed by four beams in the x direction. Since E2=2, tracking is reset after the fourth shot is completed, and since D2=2, the deflection position of the multiple beams 20 is shifted by two beam pitches. Thereby, exposure of one cycle has been completed. In the pitch cells 29 which the third beam and the fourth beam expose at the first shot, all the pixels can be exposed. Thus, in this deflection sequence, per cycle, the deflection position of the multiple beams 20 is shifted by the distance of four beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej", and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first and second beams at the first shot. Therefore, if the writing processing is started after shifting, by two beam pitches, the position of the irradiation region 34 of the first shot toward the outside of the stripe region 32 and in the movement direction of the XY stage 105, it becomes possible to expose all the pixels 36 in the stripe region 32.

Figure 23:
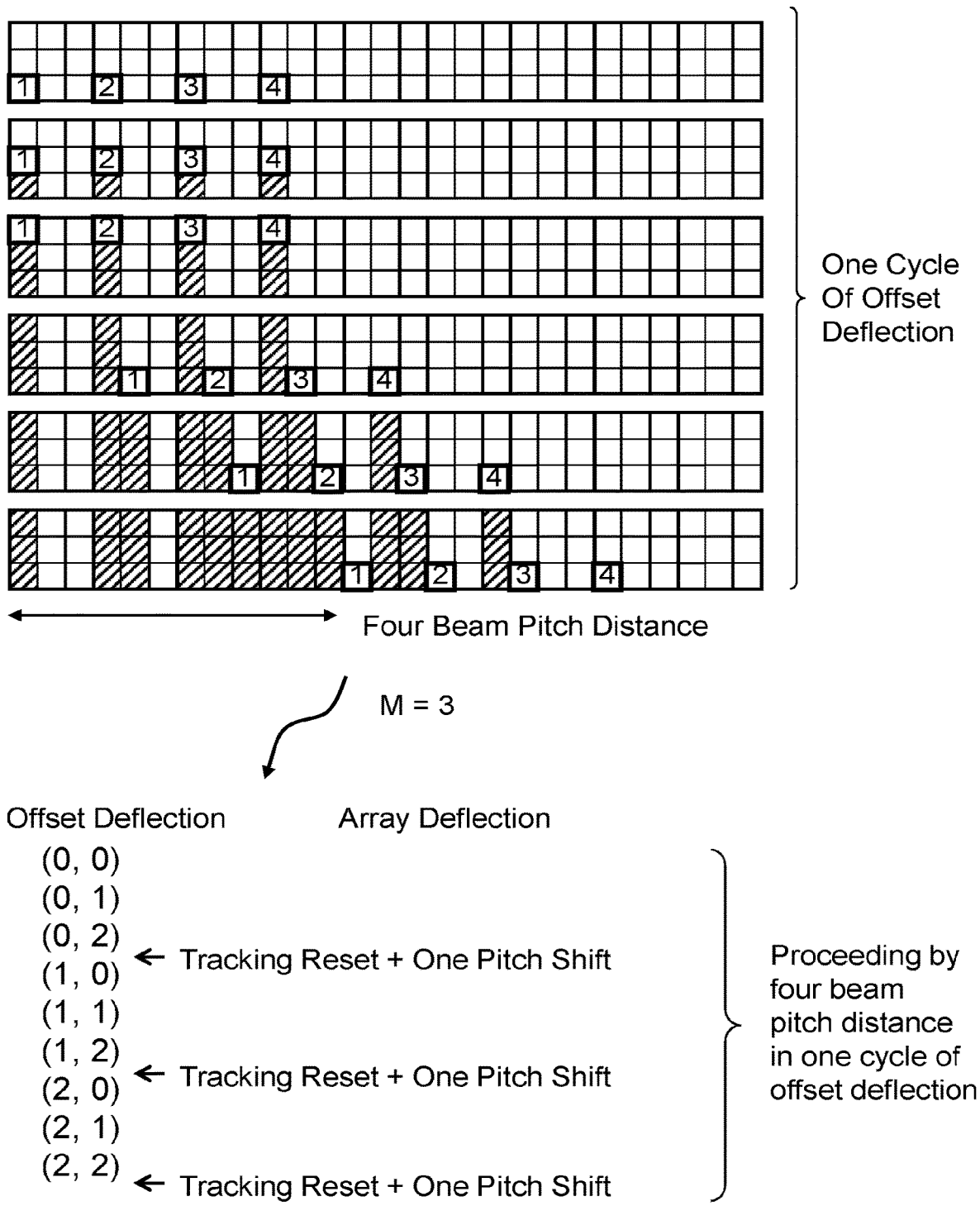
FIG. 23 shows another example of a deflection sequence according to the first embodiment.

FIG. 23 shows another example of a deflection sequence according to the first embodiment. FIG. 23 illustrates the case where b being the number of beams in the movement direction (x direction) of the XY stage 105 is four, each pitch cell 29 is composed of 3×3 pixels 36, and the designation value M for designating the number of pixels to be exposed in each tracking control is three (M=3). The example of FIG. 23 is the case of changing the pixel size and the designation value M of FIG. 21, thereby M being changed to be M=3. Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (0, 2), (1, 0) (1, 1) (1, 2), (2, 0), (2, 1), and (2, 2), and deflection is performed in this order. When the designation value M for designating the number of pixels to be exposed is three (M=3), "Ej" being the number of pixels to be exposed is calculated to be Ej=3, 3, 3 based on the method described above. The deflection movement amount "Dj" is calculated to be Dj=1, 1, 2 based on the method described above. As shown in FIG. 23, at the first shot, an offset deflection is applied to deflection coordinates (0, 0) in each pitch cell 29 and the pixel 36 at the deflection coordinates (0, 0) is exposed by four beams in the x direction. Since E1=3, it is followed by the second shot. At the second shot, the offset deflection position is shifted to the deflection coordinates (0, 1) in each pitch cell 29 and the pixel 36 at the deflection coordinates (0, 1) is exposed by four beams in the x direction. Further, it is followed by the third shot. At the third shot, the offset deflection position is shifted to the deflection coordinates (0, 2) in each pitch cell 29 and the pixel 36 at the deflection coordinates (0, 2) is exposed by four beams in the x direction. Since E1=3, tracking is reset after the third shot is completed, and since D1=1, the deflection position of the multiple beams 20 is shifted by one beam pitch. At the fourth shot, the offset deflection position is shifted to the deflection coordinates (1, 0) in each pitch cell 29 and the pixel 36 at the deflection coordinates (1, 0) is exposed by four beams in the x direction. Since E2=3, it is followed by the fifth shot. At the fifth shot, the offset deflection position is shifted to the deflection coordinates (1, 1) in each pitch cell 29 and the pixel 36 at the deflection coordinates (1, 1) is exposed by four beams in the x direction. Further, it is followed by the sixth shot. At the sixth shot, the offset deflection position is shifted to the deflection coordinates (1, 2) in each pitch cell 29 and the pixel 36 at the deflection coordinates (1, 2) is exposed by four beams in the x direction. Since E2=3, tracking is reset after the sixth shot is completed, and since D2=1, the deflection position of the multiple beams 20 is shifted by one beam pitch. At the seventh shot, the offset deflection position is shifted to the deflection coordinates (2, 0) in each pitch cell 29 and the pixel 36 at the deflection coordinates (2, 0) is exposed by four beams in the x direction. Since E3=3, it is followed by the eighth shot. At the eighth shot, the offset deflection position is shifted to the deflection coordinates (2, 1) in each pitch cell 29 and the pixel 36 at the deflection coordinates (2, 1) is exposed by four beams in the x direction. Further, it is followed by the ninth shot. At the ninth shot, the offset deflection position is shifted to the deflection coordinates (2, 2) in each pitch cell 29 and the pixel 36 at the deflection coordinates (2, 2) is exposed by four beams in the x direction. Since E3=3, tracking is reset after the ninth shot is completed, and since D3=2, the deflection position of the multiple beams 20 is shifted by two beam pitches. Thereby, exposure of one cycle has been completed. In the pitch cells 29 which the third beam and the fourth beam expose at the first shot, all the pixels can be exposed. Thus, in this deflection sequence, per cycle, the deflection position of the multiple beams 20 is shifted by the distance of four beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej", and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first and second beams at the first shot. Therefore, if the writing processing is started after shifting, by two beam pitches, the position of the irradiation region 34 of the first shot toward the outside of the stripe region 32 and in the movement direction of the XY stage 105, it becomes possible to expose all the pixels 36 in the stripe region 32.

Figure 24:
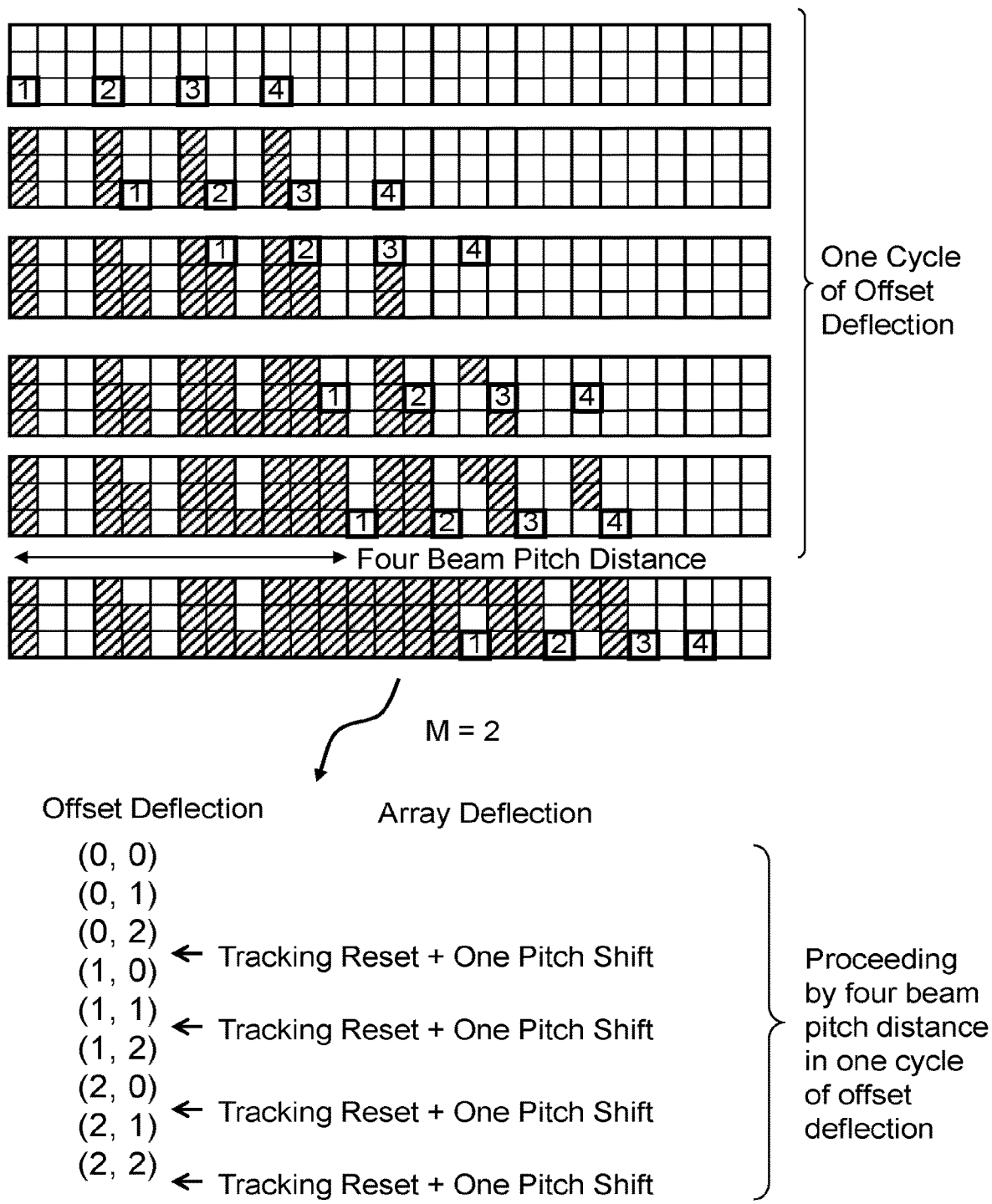
FIG. 24 shows another example of a deflection sequence according to the first embodiment.

FIG. 24 shows another example of a deflection sequence according to the first embodiment. FIG. 24 illustrates the case where b being the number of beams in the movement direction (x direction) of the XY stage 105 is four, each pitch cell 29 is composed of 3×3 pixels 36, and the designation value M for designating the number of pixels to be exposed in each tracking control is two (M=2). The example of FIG. 24 is the case of changing the designation value M of FIG. 23. Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (0, 2), (1, 0) (1, 1) (1, 2), (2, 0), (2, 1), and (2, 2), and deflection is performed in this order. When the designation value M for designating the number of pixels to be exposed is two (M=2), "Ej" being the number of pixels to be exposed is calculated to be Ej=3, 2, 2, 2 based on the method described above. The deflection movement amount "Dj" is calculated to be Dj=1, 1, 1, 1 based on the method described above. As shown in FIG. 24, at the first shot, an offset deflection is applied to deflection coordinates (0, 0) in each pitch cell 29 and the pixel 36 at the deflection coordinates (0, 0) is exposed by four beams in the x direction. Since E1=3, it is followed by the second shot. At the second shot, the offset deflection position is shifted to the deflection coordinates (0, 1) in each pitch cell 29 and the pixel 36 at the deflection coordinates (0, 1) is exposed by four beams in the x direction. Further, it is followed by the third shot. At the third shot, the offset deflection position is shifted to the deflection coordinates (0, 2) in each pitch cell 29 and the pixel 36 at the deflection coordinates (0, 2) is exposed by four beams in the x direction. Since E1=3, tracking is reset after the third shot is completed, and since D1=1, the deflection position of the multiple beams 20 is shifted by one beam pitch. At the fourth shot, the offset deflection position is shifted to the deflection coordinates (1, 0) in each pitch cell 29 and the pixel 36 at the deflection coordinates (1, 0) is exposed by four beams in the x direction. Since E2=2, it is followed by the fifth shot. At the fifth shot, the offset deflection position is shifted to the deflection coordinates (1, 1) in each pitch cell 29 and the pixel 36 at the deflection coordinates (1, 1) is exposed by four beams in the x direction. Since E2=2, tracking is reset after the fifth shot is completed, and since D2=1, the deflection position of the multiple beams 20 is shifted by one beam pitch. At the sixth shot, the offset deflection position is shifted to the deflection coordinates (1, 2) in each pitch cell 29 and the pixel 36 at the deflection coordinates (1, 2) is exposed by four beams in the x direction. Since E3=2, it is followed by the seventh shot. At the seventh shot, the offset deflection position is shifted to the deflection coordinates (2, 0) in each pitch cell 29 and the pixel 36 at the deflection coordinates (2, 0) is exposed by four beams in the x direction. Since E3=2, tracking is reset after the seventh shot is completed, and since D3=1, the deflection position of the multiple beams 20 is shifted by one beam pitch. At the eighth shot, the offset deflection position is shifted to the deflection coordinates (2, 1) in each pitch cell 29 and the pixel 36 at the deflection coordinates (2, 1) is exposed by four beams in the x direction. Since E4=2, it is followed by the ninth shot. At the ninth shot, the offset deflection position is shifted to the deflection coordinates (2, 2) in each pitch cell 29 and the pixel 36 at the deflection coordinates (2, 2) is exposed by four beams in the x direction. Since E4=2, tracking is reset after the ninth shot is completed, and since D4=1, the deflection position of the multiple beams 20 is shifted by one beam pitch. Thereby, exposure of one cycle has been completed. In the pitch cell 29 which the fourth beam exposes at the first shot, all the pixels can be exposed. Thus, in this deflection sequence, per cycle, the deflection position of the multiple beams 20 is shifted by the distance of four beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej", and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first to third beams at the first shot. Therefore, if the writing processing is started after shifting, by three beam pitches, the position of the irradiation region 34 of the first shot toward the outside of the stripe region 32 and in the movement direction of the XY stage 105, it becomes possible to expose all the pixels 36 in the stripe region 32.

Figure 25:
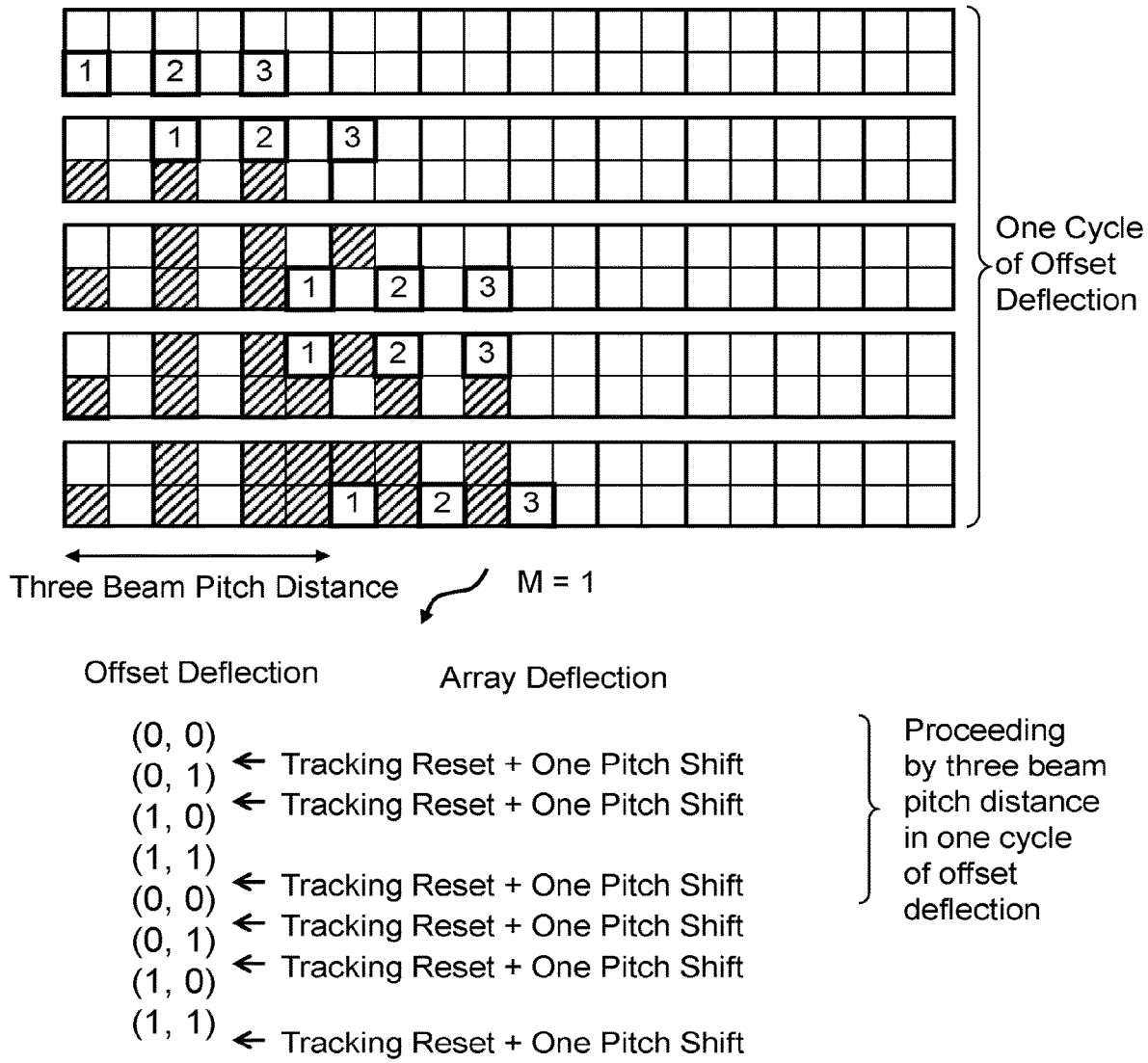
FIG. 25 shows another example of a deflection sequence according to the first embodiment.

FIG. 25 shows another example of a deflection sequence according to the first embodiment. FIG. 25 illustrates the case where b being the number of beams in the movement direction (x direction) of the XY stage 105 is three, each pitch cell 29 is composed of 2×2 pixels 36, and the designation value M for designating the number of pixels to be exposed in each tracking control is one (M=1). The example of FIG. 25 is the case of changing b being the number of beams in the x direction of FIG. 21. Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (1, 0), and (1, 1), and deflection is performed in this order. When the designation value M for designating the number of pixels to be exposed is one (M=1), "Ej" being the number of pixels to be exposed is calculated to be Ej=1, 1, 2 based on the method described above. The deflection movement amount "Dj" is calculated to be Dj=1, 1, 1 based on the method described above. As shown in FIG. 25, at the first shot, an offset deflection is applied to deflection coordinates (0, 0) in each pitch cell 29 and the pixel 36 at the deflection coordinates (0, 0) is exposed by four beams in the x direction. Since E1=1, tracking is reset after the first shot is completed, and since D1=1, the deflection position of the multiple beams 20 is shifted by one beam pitch. At the second shot, the offset deflection position is shifted to the deflection coordinates (0, 1) in each pitch cell 29 and the pixel 36 at the deflection coordinates (0, 1) is exposed by four beams in the x direction. Since E2=1, tracking is reset after the second shot is completed, and since D2=1, the deflection position of the multiple beams 20 is shifted by one beam pitch. At the third shot, the offset deflection position is shifted to the deflection coordinates (1, 0) in each pitch cell 29 and the pixel 36 at the deflection coordinates (1, 0) is exposed by four beams in the x direction. Since E3=2, it is followed by the fourth shot. At the fourth shot, the offset deflection position is shifted to the deflection coordinates (1, 1) in each pitch cell 29 and the pixel 36 at the deflection coordinates (1, 1) is exposed by four beams in the x direction. Since E3=2, tracking is reset after the fourth shot is completed, and since D3=1, the deflection position of the multiple beams 20 is shifted by one beam pitch. Thereby, exposure of one cycle has been completed. In the pitch cell 29 which the third beam exposes at the first shot, all the pixels can be exposed. Thus, in this deflection sequence, per cycle, the deflection position of the multiple beams 20 is shifted by the distance of three beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej", and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first and second beams at the first shot. Therefore, if the writing processing is started after shifting, by two beam pitches, the position of the irradiation region 34 of the first shot toward the outside of the stripe region 32 and in the movement direction of the XY stage 105, it becomes possible to expose all the pixels 36 in the stripe region 32.

Figure 26:
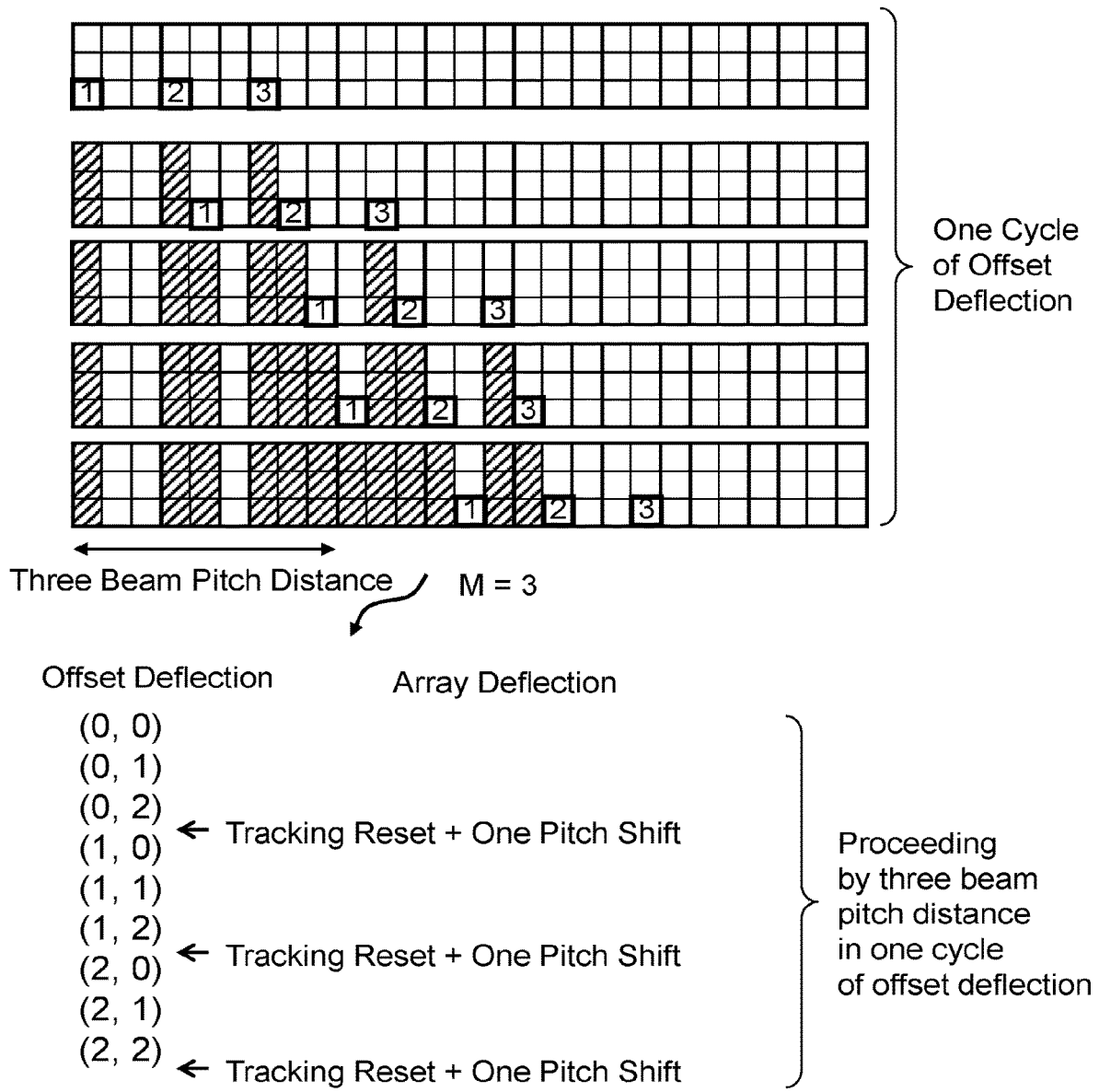
FIG. 26 shows another example of a deflection sequence according to the first embodiment.

FIG. 26 shows another example of a deflection sequence according to the first embodiment. FIG. 26 illustrates the case where b being the number of beams in the movement direction (x direction) of the XY stage 105 is three, each pitch cell 29 is composed of 3×3 pixels 36, and the designation value M for designating the number of pixels to be exposed in each tracking control is three (M=3). The example of FIG. 26 is the case of changing the pixel size and the designation value M of FIG. 25. Although describing c which is the number of beams in the y direction is omitted, the same deflection sequence can be applied regardless of c being the number of beams in the y direction. By calculation according to the method described above, a plurality of deflection coordinates (Xk, Yk) are (0, 0), (0, 1), (0, 2), (1, 0) (1, 1) (1, 2), (2, 0), (2, 1), and (2, 2), and deflection is performed in this order. When the designation value M for designating the number of pixels to be exposed is three (M=3), "Ej" being the number of pixels to be exposed is calculated to be Ej=3, 3, 3 based on the method described above. The deflection movement amount "Dj" is calculated to be Dj=1, 1, 1 based on the method described above. As shown in FIG. 26, at the first shot, an offset deflection is applied to deflection coordinates (0, 0) in each pitch cell 29 and the pixel 36 at the deflection coordinates (0, 0) is exposed by four beams in the x direction. Since E1=3, it is followed by the second shot. At the second shot, the offset deflection position is shifted to the deflection coordinates (0, 1) in each pitch cell 29 and the pixel 36 at the deflection coordinates (0, 1) is exposed by four beams in the x direction. Further, it is followed by the third shot. At the third shot, the offset deflection position is shifted to the deflection coordinates (0, 2) in each pitch cell 29 and the pixel 36 at the deflection coordinates (0, 2) is exposed by four beams in the x direction. Since E1=3, tracking is reset after the third shot is completed, and since D1=1, the deflection position of the multiple beams 20 is shifted by one beam pitch. At the fourth shot, the offset deflection position is shifted to the deflection coordinates (1, 0) in each pitch cell 29 and the pixel 36 at the deflection coordinates (1, 0) is exposed by four beams in the x direction. Since E2=3, it is followed by the fifth shot. At the fifth shot, the offset deflection position is shifted to the deflection coordinates (1, 1) in each pitch cell 29 and the pixel 36 at the deflection coordinates (1, 1) is exposed by four beams in the x direction. Further, it is followed by the sixth shot. At the sixth shot, the offset deflection position is shifted to the deflection coordinates (1, 2) in each pitch cell 29 and the pixel 36 at the deflection coordinates (1, 2) is exposed by four beams in the x direction. Since E2=3, tracking is reset after the sixth shot is completed, and since D2=1, the deflection position of the multiple beams 20 is shifted by one beam pitch. At the seventh shot, the offset deflection position is shifted to the deflection coordinates (2, 0) in each pitch cell 29 and the pixel 36 at the deflection coordinates (2, 0) is exposed by four beams in the x direction. Since E3=3, it is followed by the eighth shot. At the eighth shot, the offset deflection position is shifted to the deflection coordinates (2, 1) in each pitch cell 29 and the pixel 36 at the deflection coordinates (2, 1) is exposed by four beams in the x direction. Further, it is followed by the ninth shot. At the ninth shot, the offset deflection position is shifted to the deflection coordinates (2, 2) in each pitch cell 29 and the pixel 36 at the deflection coordinates (2, 2) is exposed by four beams in the x direction. Since E3=3, tracking is reset after the ninth shot is completed, and since D3=1, the deflection position of the multiple beams 20 is shifted by one beam pitch. Thereby, exposure of one cycle has been completed. In the pitch cell 29 which the third beam exposes at the first shot, all the pixels can be exposed. Thus, in this deflection sequence, per cycle, the deflection position of the multiple beams 20 is shifted by the distance of three beam pitches (distance obtained by multiplying the number of beams of the multiple beams 20 in the movement direction of the XY stage 105 by the beam pitch P). As described above, by generating a deflection sequence which is defined using, as parameters, a plurality of deflection coordinates (Xk, Yk), the exposure pixel number "Ej", and the deflection movement amount "Dj", and by continuing writing processing based on this deflection sequence, it becomes possible to sequentially expose all the pixels in subsequent pitch cells 29 arrayed in the opposite direction to the movement direction of the XY stage 105. In an actual writing processing, there are unexposed pixels in the pitch cells 29 exposed by the first and second beams at the first shot. Therefore, if the writing processing is started after shifting, by two beam pitches, the position of the irradiation region 34 of the first shot toward the outside of the stripe region 32 and in the movement direction of the XY stage 105, it becomes possible to expose all the pixels 36 in the stripe region 32.

Figure 27:
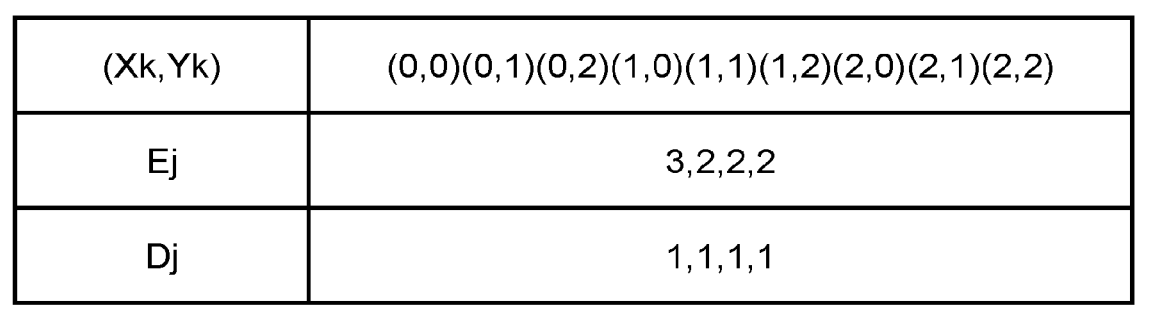

FIG. 27 shows an example of format of a deflection sequence according to the first embodiment. As shown in FIG. 27, the deflection sequence is defined using, as parameters, a plurality of deflection coordinates (Xk, Yk), the exposure pixel number "Ej", and the deflection movement amount "Dj". In the deflection sequence, the deflection movement amount "Dj" of the multiple beams 20 at the time of tracking reset is defined using the value k which is used when indicating k times the beam pitch size. FIG. 27 shows, as an example, the deflection sequence shown in FIG. 24. That is, FIG. 27 shows the case where b being the number of beams in the movement direction (x direction) of the XY stage 105 is four, each pitch cell 29 is composed of 3×3 pixels 36, and the designation value M for designating the number of pixels to be exposed in each tracking control is two (M=2). Therefore, (0, 0), (0, 1), (0, 2), (1, 0) (1, 1), (1, 2), (2, 0), (2, 1), and (2, 2) are defined as the deflection coordinates (Xk, Yk). 2, 2, 2 are defined as the "Ej" being the number of pixels to be exposed. 1, 1, 1, 1 are defined as the deflection movement amount "Dj". As described above, according to the first embodiment, the same format can define the deflection sequence under each condition even when the pixel size, the beam size, and the number of beams in a beam array to be used under each condition are different from each other.

In the case of FIG. 27, the deflection sequence format defining a plurality of deflection coordinates (Xk, Yk), the exposure pixel number "Ej", and the deflection movement amount "Dj" has been described. However, it is not limited thereto. For example, it is also preferable to use a deflection sequence format which defines, in the order of tracking control, for each tracking control, the deflection coordinates (Xk, Yk), the exposure pixel number "Ej", and the deflection movement amount "Dj" to be used for the tracking control concerned.

In the irradiation time data generation step (S120), the irradiation time data generation unit 62 calculates, for each pixel 36 having been divided, a dose D with which the pixel 36 concerned is irradiated. For example, the dose D can be calculated by multiplying a pre-set base dose $D_{base}$ by a proximity effect correction irradiation coefficient $D_p$ and a pattern area density ρ. Thus, it is preferable to obtain the dose D to be in proportion to a pattern area density having been calculated for each pixel 36. With respect to the proximity effect correction irradiation coefficient $D_p$, the writing region (here, for example, the stripe region 32) is virtually divided into a plurality of proximity mesh regions (mesh regions for proximity effect correction calculation) by a predetermined size. The size of the proximity mesh region is preferably about 1/10 of the influence range of the proximity effect, such as about 1 μm. Then, writing data is read from the storage device 140, and, for each proximity mesh region, a pattern area density ρ' of a pattern arranged in the proximity mesh region concerned is calculated.

Next, the irradiation time data generation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density ρ'. Moreover, the correction model of the proximity effect correction irradiation coefficient $D_p$ and its calculation method may be the same as those used in the conventional single beam writing method.

The irradiation time data generation unit 62 calculates, for each pixel 36, an irradiation time t of an electron beam for making a calculated dose D incident on the pixel 36 concerned, and generates irradiation time data for identifying the irradiation time t. The irradiation time t can be obtained by dividing the dose D by a current density J. For example, it is also preferable to define irradiation time data by the number of counting times of counting clock signals during a time equivalent to the irradiation time t.

In the data processing step (S130), the data processing unit 64 associates the pixel 36 with a beam for exposing the pixel concerned, based on the generated deflection sequence. The data processing unit 64 generates irradiation time data of irradiation time zero for an unused beam group other than the beam array b×c which is set for a selected writing mode in the multiple beams 20 so that the beam group may always be beam OFF. Then, the data processing unit 64 rearranges the irradiation time data in the order of shot. Irradiation time data having been data processed is stored in the storage device 142.

In the data transmission step (S132), the transmission processing unit 66 transmits the irradiation time data stored in the storage device 142 to the deflection control circuit 130.

In the writing step (S134), first, the writing control unit 68 controls the drive mechanism 214 to move the first shaping aperture array substrate 212 so that each of formed multiple beams 20, while keeping its beam pitch fixed, may be a beam size S to be set for a selected writing mode.

The writing mechanism 150 controlled by the writing control unit 68 writes a pattern on the target object 101 while deflecting the multiple beams 20 according to a deflection sequence. At that time, the writing mechanism 150 writes a pattern on the target object 101 by applying a beam array (multiple beams) whose beam pitch is fixed regardless of a selected writing mode to a plurality of pixels 36 on the surface of the target object 101 divided by the pixel size s. At that time, the writing mechanism 150 writes a pattern on the target object 101, using a beam array corresponding to the selected writing mode in all the multiple beams 20. Also, at that time, the writing mechanism 150 writes a pattern on the target object 101 with the beam array having a beam size S corresponding to the selected writing mode.

As described above, according to the first embodiment, the entire writing region can be written even when the pixel size and/or the beam array, etc. is changed.

Embodiments have been explained referring to specific examples described above. However, the present invention is not limited to these specific examples. Although, in the above examples, a plurality of deflection coordinates (Xk, Yk), the exposure pixel number "Ej", and the deflection movement amount "Dj" are calculated, in the writing apparatus 100, according to basic parameters, it is not limited thereto. The writing apparatus 100 may acquire a plurality of deflection coordinates (Xk, Yk), the exposure pixel number "Ej", and the deflection movement amount "Dj" which have been calculated outside the apparatus in advance.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-beam writing method comprising:
    acquiring a pixel size which is variable and beam array information defining a beam array to be used for exposure;
    acquiring, based on the pixel size and the beam array information, a plurality of deflection coordinates for deflecting a beam to each of a plurality of pixels which are in each beam pitch region of a plurality of beam pitch regions obtained by dividing a writing region on a target object by a beam pitch size of multiple beams, a number of pixels to be exposed by a beam in the each beam pitch region during each of tracking control periods performed such that the multiple beams collectively follow a movement of a stage, and a deflection movement amount of the multiple beams at a time of tracking reset for resetting a tracking starting position after each of the tracking control periods has passed;
    generating a deflection sequence defined using the plurality of deflection coordinates, the number of pixels to be exposed during each of the tracking control periods, and the deflection movement amount of the multiple beams at the time of tracking reset;
    writing a pattern on the target object with the multiple beams while deflecting the multiple beams according to the deflection sequence; and
    calculating the deflection movement amount of the multiple beams at the time of tracking reset, using identification information for identifying a beam array to be used for exposure in the multiple beams whose beam pitch size is set at least during writing the writing region.

2. The method according to claim 1, wherein
    as the plurality of deflection coordinates, there exist deflection coordinate pairs whose number is equivalent to a number of pixels in a rectangular region having a width of a beam pitch in x direction and a length of a beam pitch in y direction;
    in the deflection sequence, an order of deflection of the plurality of deflection coordinates is set such that beams are deflected, without overlapping, to the plurality of deflection coordinates whose number is equivalent to the number of pixels in the rectangular region;
    a plurality of exposures, defined as one cycle, performed times of a same number as the number of pixels in the rectangular region by a series of beam deflections to each of the plurality of deflection coordinates are performed being divided into a plurality of tracking control periods;

the number of pixels to be exposed during each of the tracking control periods is set such that a total of the number of pixels to be exposed during each of the tracking control periods in each cycle coincides with the number of pixels in the rectangular region; and
a deflection movement amount of the multiple beams at the time of tracking reset is set such that a total of the deflection movement amount of the multiple beams at the time of tracking reset in the each cycle coincides with a value obtained by multiplying a number of beams of the multiple beams in a movement direction of the stage by the beam pitch size.

3. The method according to claim 1, wherein, in the deflection sequence, a deflection movement amount of the multiple beams at the time of tracking reset is defined using a value k times the beam pitch size.

4. The method according to claim 1, wherein a writing mode is selected from a plurality of writing modes each defined using a designation value for designating the number of pixels to be exposed during each of the tracking control periods, a pixel size, and the identification information for identifying a beam array to be used for exposure in the multiple beams whose beam pitch size is set at least during writing the writing region, further comprising:
setting, with reference to a correlation table variably defined according to the plurality of writing modes, the plurality of deflection coordinates to a plurality of pixel regions obtained by dividing the writing region by the pixel size defined for the writing mode selected;
calculating, with reference to the correlation table, the number of pixels to be exposed during each of the tracking control periods, using the designation value for designating the number of pixels defined for the writing mode selected; and
calculating, with reference to the correlation table, the deflection movement amount of the multiple beams at the time of tracking reset, using the identification information for identifying a beam array, in the multiple beams, to be used for exposure which is defined for the writing mode selected.

5. A multi-beam writing apparatus comprising:
a parameter acquisition circuit configured to acquire a pixel size which is variable and beam array information defining a beam array to be used for exposure;
an acquisition circuit configured to acquire, based on the pixel size and the beam array information, a plurality of deflection coordinates for deflecting a beam to each of a plurality of pixels which are in each beam pitch region of a plurality of beam pitch regions obtained by dividing a writing region on a target object by a beam pitch size of multiple beams, a number of pixels to be exposed by a beam in the each beam pitch region during each of tracking control periods performed such that the multiple beams collectively follow a movement of a stage, and a deflection movement amount of the multiple beams at a time of tracking reset for resetting a tracking starting position after a tracking control period has passed;
a generation circuit configured to generate a deflection sequence defined using the plurality of deflection coordinates, the number of pixels to be exposed during each of the tracking control periods, and the deflection movement amount of the multiple beams at the time of tracking reset;
a writing mechanism configured to include a movable stage for mounting the target object thereon and a deflector for deflecting the multiple beams, and configured to write a pattern on the target object with the multiple beams while deflecting the multiple beams according to the deflection sequence; and
a deflection movement amount calculation circuit configured to calculate the deflection movement amount of the multiple beams at the time of tracking reset, using identification information for identifying a beam array to be used for exposure in the multiple beams whose beam pitch size is set at least during writing the writing region.

6. The apparatus according to claim 5, further comprising:
a selection circuit configured to select a writing mode from a plurality of writing modes each defined using a designation value for designating the number of pixels to be exposed during each of the tracking control periods, a pixel size, and the identification information for identifying a beam array to be used for exposure in the multiple beams whose beam pitch size is set at least during writing the writing region;
a deflection coordinate setting circuit configured to set, with reference to a correlation table variably defined according to the plurality of writing modes, the plurality of deflection coordinates to a plurality of pixel regions obtained by dividing the writing region by the pixel size defined for the writing mode selected; and
an exposure pixel number calculation circuit configured to calculate, with reference to the correlation table, the number of pixels to be exposed during each of the tracking control periods, using the designation value for designating the number of pixels defined for the writing mode selected,
wherein the deflection movement amount calculation circuit is configured to calculate, with reference to the correlation table, the deflection movement amount of the multiple beams at the time of tracking reset, using the identification information for identifying a beam array, in the multiple beams, to be used for exposure which is defined for the writing mode selected.

7. A multi-beam writing method comprising:
selecting a writing mode from a high accuracy writing mode for writing highly accurately and a high speed writing mode for writing at high speed;
dividing a writing region on a target object to be irradiated with multiple beams into a plurality of pixel regions by a pixel size which is variable according to the writing mode selected; and
writing a pattern on the target object by applying the multiple beams whose beam pitch is fixed regardless of the writing mode selected to a plurality of pixels on the target object divided by the pixel size,
wherein tracking control is performed such that the multiple beams collectively follow a movement of a stage in a case of writing the pattern, further comprising:
calculating a deflection movement amount of the multiple beams at a time of tracking reset for resetting a tracking starting position after a tracking control period has passed, using identification information for identifying a beam array, to be used for exposure, set according to the writing mode selected, in the multiple beams.

8. The method according to claim 7, wherein any of the pixel size which is variable is set to be 1/n (n=integer) of the beam pitch of the multiple beams.

9. A multi-beam writing apparatus comprising:
a selection circuit configured to select a writing mode from a high accuracy writing mode for writing highly accurately and a high speed writing mode for writing at high speed;

a division circuit configured to divide a writing region on a target object to be irradiated with multiple beams into a plurality of pixel regions by a pixel size which is variable according to the writing mode selected; and a writing mechanism configured to include a stage for mounting the target object thereon and a deflector for deflecting the multiple beams, and to write a pattern on the target object by applying the multiple beams whose beam pitch is fixed regardless of the writing mode selected to a plurality of pixels on the target object divided by the pixel size, wherein tracking control is performed such that the multiple beams collectively follow a movement of the stage in a case of writing the pattern, further comprising:

calculating a deflection movement amount of the multiple beams at a time of tracking reset for resetting a tracking starting position after a tracking control period has passed, using identification information for identifying a beam array, to be used for exposure, set according to the writing mode selected, in the multiple beams.

10. The apparatus according to claim 9, wherein the division circuit uses a pixel size being 1/n (n=integer) of the beam pitch of the multiple beams, as the pixel size which is variable according to the writing mode selected.

* * * * *